United States Patent
Akin et al.

(10) Patent No.: US 9,877,554 B2
(45) Date of Patent: Jan. 30, 2018

(54) SOLAR-POWERED CHARGING UMBRELLA WITH USB PORTS

(71) Applicant: ZON, Manhattan Beach, CA (US)

(72) Inventors: Sarah Akin, Manhattan Beach, CA (US); David Johnson, San Francisco, CA (US)

(73) Assignee: ZON, Manhattan Beach, CA (US)

( * ) Notice: Subject to any disclaimer, the term of this patent is extended or adjusted under 35 U.S.C. 154(b) by 152 days.

(21) Appl. No.: 14/803,724

(22) Filed: Jul. 20, 2015

(65) Prior Publication Data

US 2015/0320162 A1 Nov. 12, 2015

Related U.S. Application Data

(63) Continuation of application No. 13/953,727, filed on Jul. 29, 2013, now Pat. No. 9,088,181.

(60) Provisional application No. 61/676,454, filed on Jul. 27, 2012.

(51) Int. Cl.
| | |
|---|---|
| H02J 7/00 | (2006.01) |
| A45B 25/02 | (2006.01) |
| H02J 7/35 | (2006.01) |
| H02J 7/02 | (2016.01) |
| A45B 23/00 | (2006.01) |
| A45B 25/10 | (2006.01) |
| H01L 31/042 | (2014.01) |
| H01M 2/10 | (2006.01) |

(Continued)

(52) U.S. Cl.
CPC .............. *A45B 25/02* (2013.01); *A45B 23/00* (2013.01); *A45B 25/10* (2013.01); *H01L 31/042* (2013.01); *H01M 2/1055* (2013.01); *H01M 10/465* (2013.01); *H02J 7/0047* (2013.01); *H02J 7/0052* (2013.01); *H02J 7/025* (2013.01); *H02J 7/35* (2013.01); *H02J 7/355* (2013.01); *A45B 2023/0012* (2013.01); *A45B 2023/0037* (2013.01); *A45B 2025/003* (2013.01); *A45B 2200/1027* (2013.01); *A45B 2200/1063* (2013.01); *H01M 2220/30* (2013.01); *H02J 7/0042* (2013.01); *H02J 2007/005* (2013.01); *H02J 2007/0062* (2013.01); *Y02B 10/10* (2013.01); *Y02E 10/50* (2013.01)

(58) Field of Classification Search
CPC ........................ H02J 7/355; H02J 2007/0062
USPC ......................................................... 320/108
See application file for complete search history.

(56) References Cited

U.S. PATENT DOCUMENTS

| | | | |
|---|---|---|---|
| 7,614,600 | B1 | 11/2009 | Smith et al. |
| 9,185,988 | B1 * | 11/2015 | Sanchez |
| 2005/0146876 | A1 | 7/2005 | Li |

(Continued)

FOREIGN PATENT DOCUMENTS

KR 10-1112638 B1 2/2012

*Primary Examiner* — Suchin Parihar
(74) *Attorney, Agent, or Firm* — Aka Chan LLP

(57) ABSTRACT

A solar-powered umbrella has a cap structure that is connected by hinges to struts. The struts are relatively rigid and positioned above the umbrella shade and house solar panels. When the umbrella is opened and closed, the struts rotate via the hinges from an open to closed position. When the solar panels are exposed to the sun, light is converted to electrical energy to charge a rechargeable battery. The battery supplies power to one or more USB ports. A user can recharge an electronic device (e.g., smartphone or tablet computer) by connecting to a port of the umbrella using a cable.

21 Claims, 27 Drawing Sheets

(51) Int. Cl.
*H01M 10/46* (2006.01)
*A45B 25/00* (2006.01)

(56) References Cited

U.S. PATENT DOCUMENTS

| | | |
|---|---|---|
| 2005/0161067 A1 | 7/2005 | Hollins |
| 2006/0124157 A1 | 6/2006 | Ertugrul |
| 2007/0124157 A1 | 5/2007 | Laumeyer et al. |
| 2007/0242450 A1 | 10/2007 | Blatecky |
| 2008/0006312 A1 | 1/2008 | Li |
| 2008/0105287 A1 | 5/2008 | Huali et al. |
| 2009/0058354 A1* | 3/2009 | Harrison ................. 320/101 |
| 2010/0154786 A1 | 6/2010 | Li |
| 2010/0307547 A1* | 12/2010 | Li ................. 135/16 |
| 2011/0203633 A1 | 8/2011 | Richardson |
| 2011/0265694 A1 | 11/2011 | Portis et al. |
| 2012/0017954 A1* | 1/2012 | Li ................. 135/96 |
| 2012/0235477 A1* | 9/2012 | Korman ............ H01L 31/042 307/11 |
| 2013/0234645 A1 | 9/2013 | Goei et al. |
| 2013/0240006 A1* | 9/2013 | Chaimovski et al. ......... 135/16 |
| 2014/0009103 A1* | 1/2014 | Nita ............... 320/101 |
| 2014/0144490 A1 | 5/2014 | Richardson |
| 2014/0150837 A1 | 6/2014 | Darquea et al. |
| 2014/0211489 A1 | 7/2014 | Braaten-Boyd |

* cited by examiner

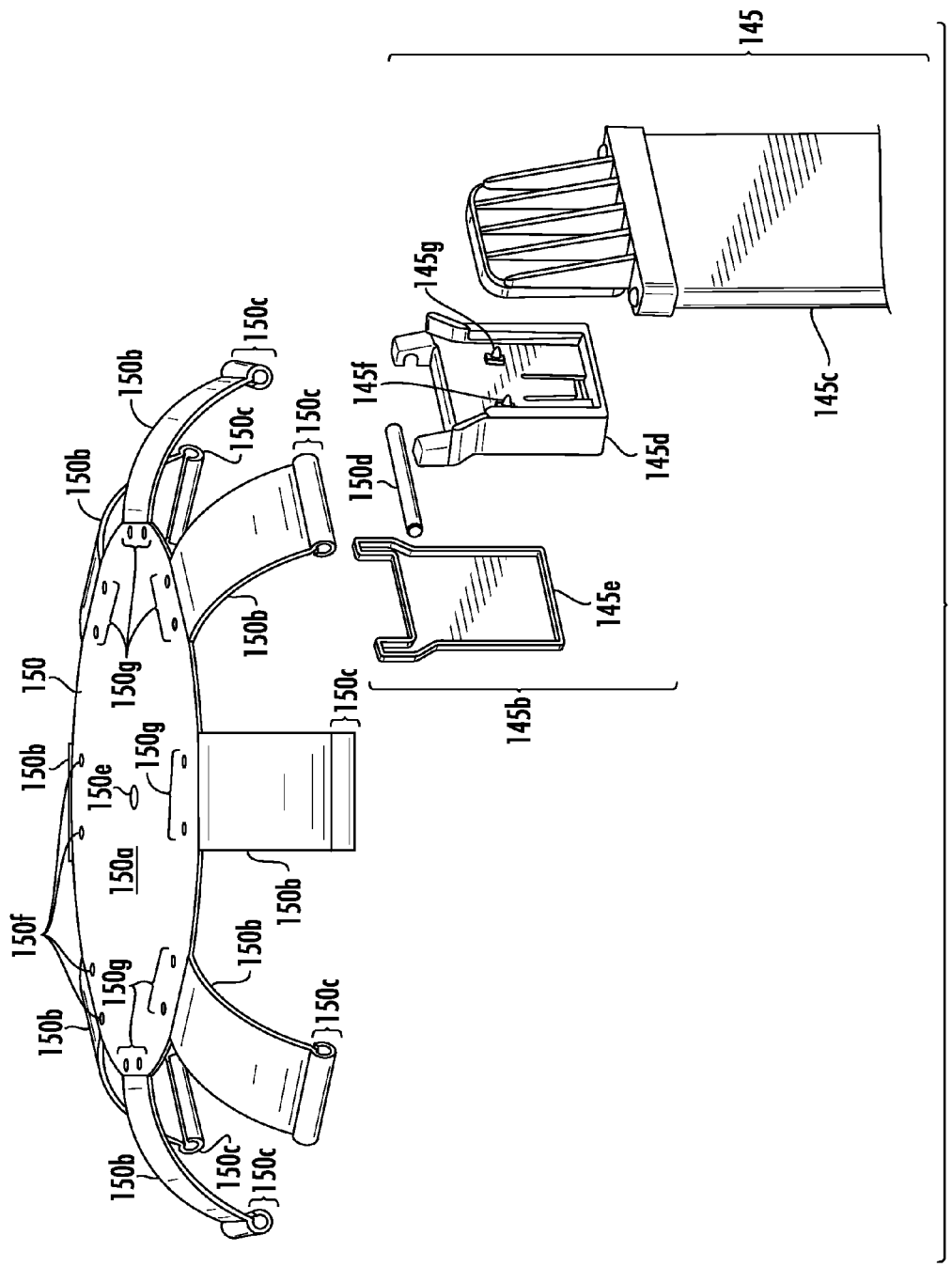

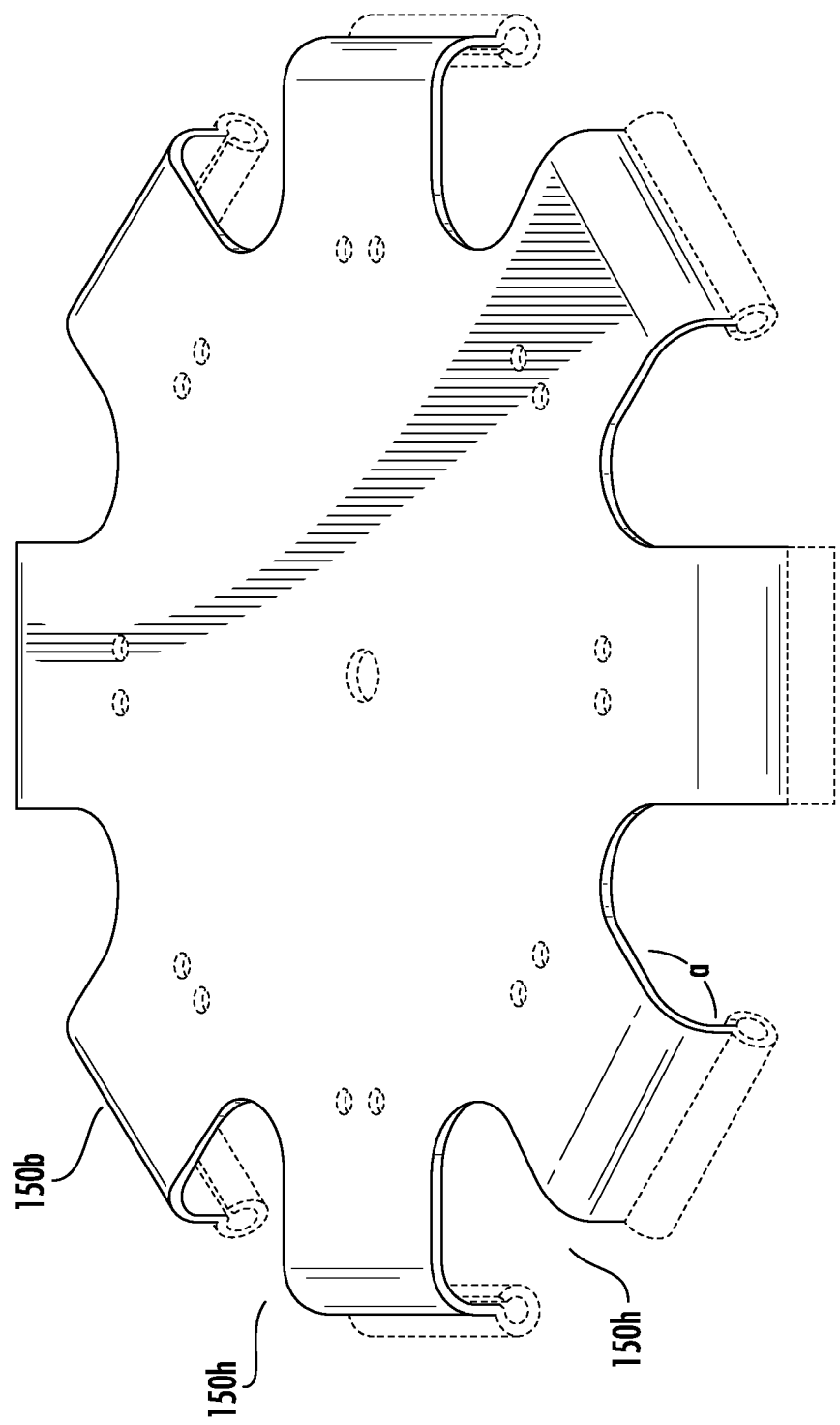

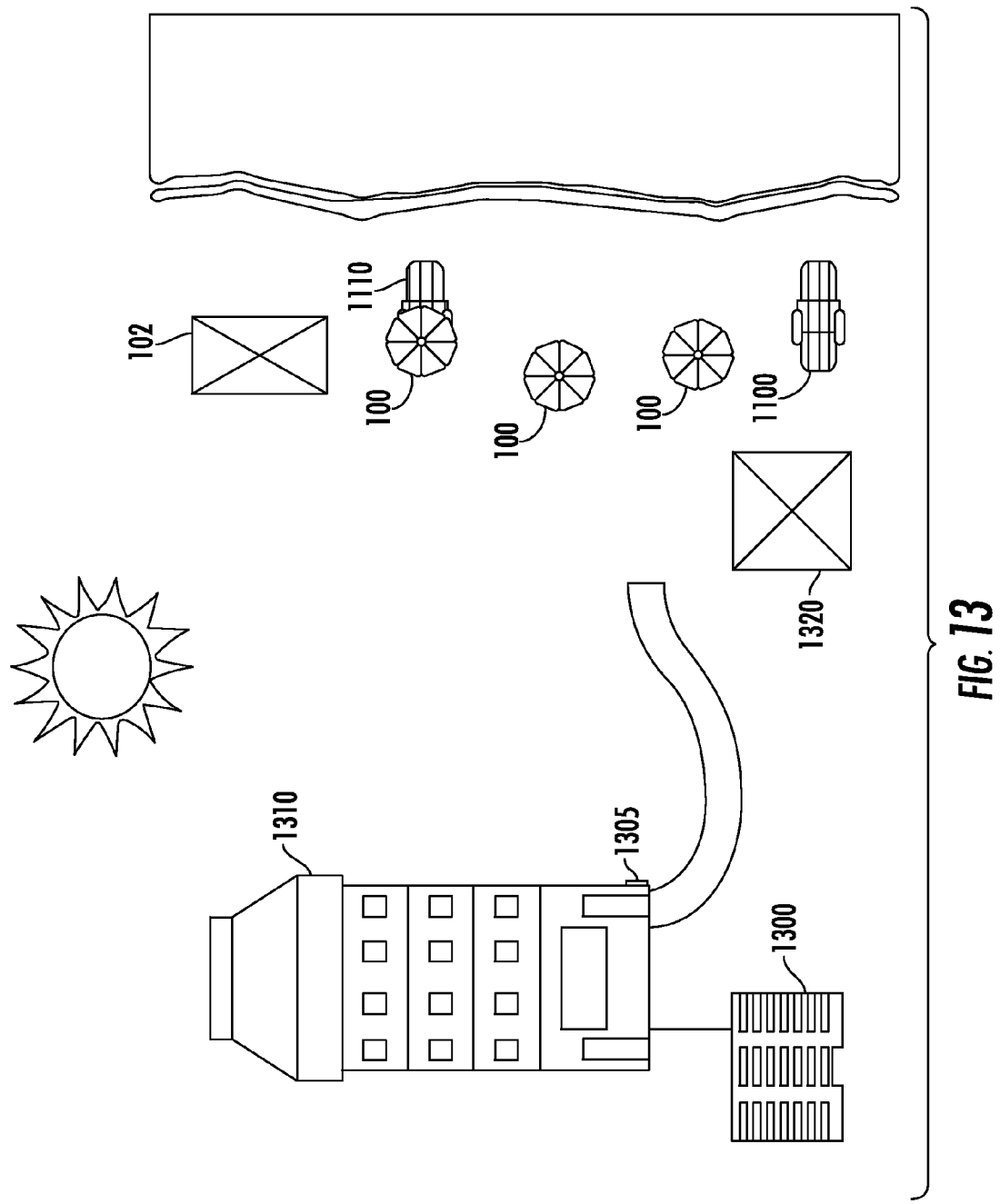

SOLAR-POWERED CHARGING UMBRELLA WITH USB PORTS

CROSS-REFERENCE TO RELATED APPLICATIONS

This patent application is a continuation of U.S. patent application Ser. No. 13/953,727, filed Jul. 29, 2013, issued as U.S. Pat. No. 9,088,181 on Jul. 21, 2015, which claims the benefit of U.S. patent application 61/676,454, filed Jul. 27, 2012, and is a continuation-in-part of U.S. design patent application Ser. Nos. 29/461,657; 29/461,658; 29/461,659; 29/461,660; 29/461,661; and 29/461,662, filed Jul. 26, 2013. These applications are incorporated by reference along with all other references cited in this application.

BACKGROUND

The present invention generally relates to furniture. More particularly, embodiments of the present invention provide outdoor furniture having integrated solar panels for powering and charging portable electric devices.

Outdoor furniture is a type of furniture that is often used during daylight hours to provide comfortable outdoor seating, to shade users from the sun, or both. Outdoor furniture is commonly set up, for example, by swimming pools, on beaches, on patios, at picnic areas, at outdoor dining areas, on the decks of boats and ships, and at other outdoor recreational areas. Outdoor furniture is often used a relatively long distance away from electrical power sources. Since users often spend up to several hours using outdoor furniture while partaking in outdoor activities, the portable electronic device (e.g., mobile phones, tablet computers, personal digital assistants, portable music players, or portable televisions) that users use outdoors may run out of power and need to be charged.

As a result, users may have to use portable battery packs to recharge portable electronic devices, or manually run electrical lines from a main power source out to areas where outdoor furniture is located. Battery packs are often not designed to charge larger devices, such as tablet computers, and often are not capable of charging more than one device at a time. Furthermore, battery packs have a limited amount of stored power. Once a battery pack discharges, no power remains for charging portable electronic devices. Running a power line from a main power source to where users are at outdoors is often not possible where no power supply exists or is not practical where no power supply is reasonably close.

Therefore, an impetus exists for providing a convenient charging device for outdoor use for charging portable electronic devices.

BRIEF SUMMARY OF THE INVENTION

A solar-powered umbrella has a cap structure that is connected by hinges to struts. The struts are relatively rigid and positioned above the umbrella shade and house solar panels. When the umbrella is opened and closed, the struts rotate via the hinges from an open to closed position. When the solar panels are exposed to the sun, light is converted to electrical energy to charge a rechargeable battery. The battery supplies power to one or more USB ports. A user can recharge an electronic device (e.g., smartphone or tablet computer) by connecting to a port of the umbrella using a cable.

Further, outdoor furniture, such as umbrellas, sunshades, chairs, lounge chairs, and the like incorporate solar panels to supply portable electrical power for users to power and charge portable electronic device.

According to one embodiment, a device includes a frame structure, and a shade attached to the frame structure. The device also includes a solar panel that is attached to the frame structure and is positioned above the shade. The device also includes a rechargeable battery that is configured to be recharged by the solar panel. A charging terminal of the device is configured to connect to a portable electronic device and supply charge from the rechargeable battery to the portable electronic device for charging the portable electronic device.

According to one specific embodiment, the device further includes an umbrella pole attached to the frame structure, and a printed circuit board having an aperture formed therein for receiving the umbrella pole. The aperture is centrally located in the printed circuit board. The printed circuit board may be round and may be substantially centered about the umbrella pole.

According to another specific embodiment, the device further includes a battery shelf having an aperture formed therein for receiving the umbrella pole, and the rechargeable battery is positioned on the battery shelf. The rechargeable battery may be substantially cylindrical and may have a central aperture formed therein that is configured to receive the umbrella pole. The central aperture of the rechargeable battery may substantially center the rechargeable battery on the umbrella pole. The battery shelf is positioned above the printed circuit board.

According to another specific embodiment, the device further includes a cap positioned at a top of the umbrella pole and has a connector, which is configured to hinge couple to an end of the solar panel. According to another specific embodiment, the device further includes a plurality of solar panels where the above mentioned solar panel is included in the plurality of solar panels, and the cap has a plurality of connectors wherein the above mentioned connector is included in the plurality of connectors. The connectors are configured to respectively hinge couple to ends of the solar panels. Each connector includes a curved arm that curves downward to a hinge portion of the connectors and the hinge portions are configured to respectively hinge couple to the ends of the solar panels.

According to another specific embodiment, each of the solar panels includes a housing and a plurality of photovoltaic cells positioned in the housing. The photovoltaic cells in each of the housings are configured to generate 12 volts of direct current.

According to another specific embodiment, the frame structure is configured to fold downward to close the shade and unfold upward to open the shade. The solar panels are configured to hinge downward about the ends and the connectors as the frame structure is folded downward. The solar panels are configured to hinge upward about the ends and the connectors as the frame structure is unfolded upward.

According to another specific embodiment, the device further includes a table positioned below the printed circuit board and configured to support the portable electronic device during charging. The table has an aperture formed therein for receiving the umbrella pole. The aperture of the table may be substantially centered in the table so that table may be substantially centered about the umbrella pole.

According to another specific embodiment, the charging terminal is a universal serial bus charging terminal.

According to another specific embodiment, the device further includes a battery charge indicator configured to indicate an amount of charge in the rechargeable battery. The battery charging indicator includes a plurality of lights configured to indicate the amount of charge in the rechargeable battery, and the plurality of lights may include a plurality of light emitting diodes.

According to another embodiment, a device includes a printed circuit board having an aperture formed therein, and a circuit mounted on the printed circuit board. The aperture is configured to receive an umbrella pole of an umbrella. The circuit is configured to receive electrical energy from a solar panel on the umbrella and charge a rechargeable battery of the umbrella with the electrical energy.

According to a specific embodiment, the aperture is substantially centered in the printed circuit board and is configured to position the umbrella pole substantially about a center of the printed circuit board. The printed circuit board is substantially round and is configured to be substantially centered about the umbrella pole.

According to another specific embodiment, the circuit includes a plurality of charging terminals configured to connect to a corresponding plurality of portable electronic devices for charging the portable electronic devices from charge stored in the rechargeable battery. The charging terminals may be universal serial bus charging terminals.

According to another specific embodiment, the circuit includes a control circuit connected to the charging terminals and configured to communicate with a portable electronic device connected to one of the charging terminals to collect device type information from the portable electronic device. The circuit includes an authentication circuit configured to receive the device type information from the control circuit and determine a set of charging parameters for the portable electronic device based on the charging parameters. The circuit includes a DC-to-DC converter electrically connected to the plurality of charging terminals. The DC-to-DC converter is configured to be electrically connected to the rechargeable battery and convert electrical energy received from the rechargeable battery for generating converted electrical energy and supply the converted electrical energy to the plurality of charging terminals. The control circuit, the authentication circuit, or both is configured to configure the DC-to-DC converter based on the set of charging parameters for charging the portable electronic device. The charging parameters specify a charging voltage, a charging current, or both for the portable electronic device.

According to another specific embodiment, the circuit includes an analog-to-digital (A-to-D, A/D, or ADC) converter configured to measure a voltage of the rechargeable battery and generate a digital value for the voltage. The circuit also includes a battery gauge connected to the A-to-D converter and configured to receive the digital value for the voltage and determine an amount of charge stored in the rechargeable battery based on the digital value for the voltage.

According to another specific embodiment, the device further includes a solar panel, and a battery-charging controller where the battery-charging controller is configured to receive the electrical energy from the solar panel and convert the electrical energy for charging the rechargeable battery. Converting the electrical energy may include performing a DC-to-DC conversion on the electrical energy received from the solar panel.

According to another specific embodiment, the device further includes a battery level indicator configured to indicate to a user the amount of the charge stored in the rechargeable battery. The battery level indicator includes a plurality of lights, such as light emitting diodes (LEDs), for indicating the amount of the charge stored in the rechargeable battery. The device may further include a controller for the battery level indictor for controlling the battery level indicator to indicate the charge stored in the battery via the plurality of lights.

According to another embodiment, a device includes a circuit for a piece of outdoor furniture comprising a charging terminal configured to electrically coupled to an electric device for charging the electronic device, wherein the charging terminal is configured to receive electrical energy from a solar panel. The charging terminal may be a universal serial bus port.

According to a specific embodiment, the circuit further includes a control circuit connected to the charging terminal and configured to communicate with a portable electronic device connected to the charging terminal to collect device type information from the portable electronic device. The circuit further includes an authentication circuit configured to receive the device type information from the control circuit and determine a set of charging parameters for the portable electronic device based on the charging parameters.

According to another specific embodiment, the circuit further includes a DC-to-DC converter electrically coupled to the charging terminal. The control circuit, the authentication circuit, or both is configured to configure the DC-to-DC converter to convert the electrical energy to converted electric energy based on the set of charging parameters and supply the converted electrical energy to the charging terminal based on the set of charging parameters for charging the portable electronic device. The DC-to-DC converter is configured to receive the electrical energy from the solar panel. The DC-to-DC converter is configured to receive the electrical energy from a rechargeable battery. According to another specific embodiment, the charging parameters specify a charging voltage, a charging current, or both for the portable electronic device.

According to another specific embodiment, the circuit further includes an analog-to-digital (A-to-D, A/D, or ADC) converter configured to measure a voltage of a rechargeable battery and generate a digital value for the voltage. The circuit further includes a battery gauge connected to the A-to-D converter and configured to receive the digital value for the voltage and determine an amount of charge stored in the rechargeable battery based on the digital value for the voltage. The circuit further includes a battery level indicator coupled to the battery gauge and configured to provide a signal for a user indicating the amount of charge stored in the rechargeable battery. The battery level indicator includes a plurality of light emitting diodes (LEDs) for indicating the amount of the charge stored in the rechargeable battery. The circuit further includes a controller for the battery level indictor for controlling the battery level indicator to provide the signal for the amount of charge stored in the rechargeable battery. The circuit further includes a battery-charging controller, and the battery-charging controller is configured to receive the electrical energy from the solar panel and convert the electrical energy for charging a rechargeable battery.

According to one embodiment, a device includes a piece of outdoor furniture where the piece of outdoor furniture includes a battery gauge configured determine an amount of charge stored in a rechargeable battery of the outdoor furniture based on a voltage of the rechargeable battery, and a battery level indicator coupled to the battery gauge and configured to provide a signal for a user indicating the amount of charge stored in the rechargeable battery.

According to a specific embodiment, the battery level indicator includes a display configured to indicate the amount of the charge stored in the rechargeable battery. The display is configured to display numbers or text to indicate the amount of charge. The display includes a plurality of lights, and a number of the lights lighted indicates an amount of charge stored in the battery. An increasing number of the lights being lighted indicates a corresponding increasing amount of charge stored in the rechargeable battery, and a decreasing number of the lights being lighted indicates a corresponding decreasing amount of charge stored in the rechargeable battery. The lights may be light emitting diodes.

According to another specific embodiment, the piece of outdoor further includes a controller for controlling the battery level indictor to provide the signal for the amount of charge stored in the rechargeable battery. The controller is a user operable controller.

According to another specific embodiment, the piece of outdoor furniture further includes an analog-to-digital (A-to-D, A/D, or ADC) converter configured to measure a voltage output by the rechargeable battery and generate a digital value for the voltage. The battery gauge is communicatively coupled to the A-to-D converter and is configured to receive the digital value for the voltage from the A-to-D converter. The battery gauge is configured to determine an amount of charge stored in the rechargeable battery based on the digital value for the voltage.

According to another specific embodiment, the piece of outdoor furniture further includes a solar panel configured to generate electrical energy for charging the rechargeable battery. The piece of outdoor furniture further includes a battery-charging controller, and the battery-charging controller is configured to receive the electrical energy from the solar panel and convert the electrical energy for charging the rechargeable battery. The battery-charging controller includes a DC-to-DC converter configured to convert the electrical energy to converted electrical energy for charging the rechargeable battery. Converting the electrical energy includes converting a voltage of the electrical energy.

According to another specific embodiment, the piece of outdoor furniture is an umbrella, a chair, such as a chaise lounge, or a sunshade. The umbrella embodiment includes an umbrella pole and the battery gauge and the battery level indicator are coupled to the umbrella pole.

According to one embodiment, a method includes determining, via a battery gauge of a piece of outdoor furniture, an amount of charge stored in a rechargeable battery of the outdoor furniture based on a voltage of the rechargeable battery, and displaying, via a battery level indicator of the piece of outdoor furniture, a signal for a user indicating the amount of charge stored in the rechargeable battery.

According to another specific embodiment, the method further includes performing an analog measurement of the voltage; converting a value of the voltage from analog measurement to a digital value of the voltage; and transferring the digital value to battery gauge.

According to another specific embodiment, the displaying step includes displaying the signal in numbers or text, displaying the signal via a plurality of lights, and a number of the lights lighted indicates the amount of charge. The method further includes increasing the number of the lights being lighted indicates a corresponding increasing amount of charge stored in the rechargeable battery. The method further includes decreasing the number of the lights being lighted indicates a corresponding decreasing amount of charge stored in the rechargeable battery. The lights may be light emitting diodes. The method further includes receiving a signal from a user, via a controller of the outdoor furniture, for lighting the lights.

According to one embodiment, a device includes a piece of outdoor furniture, wherein the piece of outdoor furniture comprises a charging terminal configured to connect to a portable electronic device and supply charge to the portable electronic device for charging the portable electronic device. The charging terminal is configured to supply charge to the portable electronic device from a rechargeable battery, or from a solar panel. The charging terminal may be a universal serial bus (USB) port that is configured to operate according to a USB protocol.

According to a specific embodiment, the piece of outdoor furniture is an umbrella having an umbrella pole and the charging terminal is coupled to the umbrella pole. The charging terminal may include a wire coupled to an end terminal and the wire and the end terminal extend from the umbrella pole. The umbrella pole may be configured to retract the wire into the umbrella pole.

According to another specific embodiment, the umbrella includes a battery housing having a charging-terminal aperture formed therein, and the charging terminal is accessible via the charging-terminal aperture. The charging terminal may include a wire coupled to an end terminal and the wire and end terminal extend from the battery housing. The battery housing may be configured to retract the wire into the battery housing. The battery housing has a substantially central aperture formed therein and the substantially central aperture is configured to receive the umbrella pole.

According to another specific embodiment, the charging terminal comprises a coaxial connector configured to provide a DC voltage. The DC voltage may be 12 volts. The charging terminal includes an inverter configured to invert a DC voltage to an AC voltage.

According to one embodiment, a device includes a battery housing for an umbrella comprising a first portion configured to house a printed circuit board and a second portion configured to house a battery, wherein the battery housing has a charging aperture formed therein, and the charging aperture is configured for accessing a charging terminal positioned inside the battery housing. The first portion is substantially cylindrical and has a first diameter. The second portion is substantially cylindrical and has a second diameter. The diameter of the first portion is greater than the diameter of the second portion.

According to another specific embodiment, the battery housing has a substantially central aperture formed therein. The substantially central aperture is configured to receive an umbrella pole of the umbrella. The substantially central aperture is configured for the umbrella pole to be oriented longitudinally trough the battery housing. The battery housing includes a top and the substantially central aperture is formed in the top. The charging aperture is formed in the first portion. An indicator aperture is formed in the first portion adjacent to the charging aperture, and the indicator aperture is configured for viewing a connector indicator, which indicates whether a portable electronic device connected to the charting terminal is charging or charged.

According to one embodiment, a cap for an umbrella includes a body having a central portion and a side; and a plurality of arms attached to the body. Each arm extends downward from the body and each arm has an arc shape.

According to a specific embodiment, each arm includes a first end portion that attaches to the body and a second end portion, which is oppositely disposed on the arm from the first end portion, and wherein each second arm portion includes of a hinge portion. Each hinge portion is configured to hinge attach to a solar panel of the umbrella, and each arm is curved and configured to flex as the umbrella is opened and closed. The flex allows for lateral movement of the solar panels as the umbrella is opened and closed. Each of the hinge portions includes a barrel, and each of the barrels is configured to receive a hinge pin, which is configured to hinge attach to a solar panel of the umbrella.

According to another specific embodiment, the central portion is substantially flat, and is substantially round. The central portion of the body may include a plurality of apertures formed therein for attaching the central portion of the body to struts of the umbrella. The central portion of the body includes a plurality of fasteners formed therein for attaching the central portion of the body to struts of the umbrella.

According to one embodiment, a method for charging a portable electronic device includes converting light to electrical energy via a solar panel of a piece of outdoor furniture, and storing the electrical energy in a rechargeable battery of the piece of outdoor furniture. The rechargeable battery is configured to provide sufficient current for charging a plurality of portable electronic devices simultaneously. The method includes detecting a device type of a portable electronic device connected to a charging terminal of the piece of outdoor furniture, and determining a charging voltage and a charging current based on the device type. The method includes configuring a charging circuit of the piece of outdoor furniture to supply the charging voltage and the charging current to the portable electronic device, and supplying the charging voltage and the charging current to the portable electronic device for charging.

According to a specific embodiment, the charging circuit includes a DC-to-DC converter, which is configurable for supplying a range of charging voltages and a range of charging currents. The method further includes measuring a voltage output by the rechargeable battery via an analog-to-digital converter of the piece of outdoor furniture; determining a charge state of the rechargeable battery, via a battery gauge of the piece of outdoor furniture, from the voltage output by the rechargeable battery; and providing an indication to a user for the charge state of the rechargeable battery via a battery level indicator of the piece of outdoor furniture.

According to another specific embodiment, the determining step includes communicating with the portable device via a universal serial bus protocol by a control circuit of the piece of outdoor furniture. The piece of outdoor furniture is an umbrella.

Advantages of embodiments of the present invention provide for the solar panels to be integrated into sunshades and other movable furniture. For example, these can include stand-alone umbrellas, detachable umbrellas (e.g., compatible for use with chairs or lounges), table umbrellas, beach umbrellas, pool umbrellas, and other umbrellas; awnings; shades; shelters; tents, gazebos; curtains or drapes; canopies; sails; and shade structures. The solar panel can also be integrated into movable items not necessarily compatible with furniture. For example, these can include car window shades, stroller shades, and portable pet shelters. Further, a solar panel can also be integrated with camping and related items. For example, these can include tents and tent-like structures, shelters, backpacks, sleeping pads, mattresses, hammocks and cots, tarps, and sleeping bags.

Another advantage is the ability to provide a mobile supply of electricity to users because elements of the system (i.e., solar panel, battery, ports, and connector) are integrated into the sunshades and furniture. A user need not depend on an electrical outlet for electrical power because there is battery storage within the sunshade or furniture itself. As a result, a user can change location outdoors throughout the day while maintaining a continuous supply of electrical power. For example, a user can charge a smartphone using a portable, detachable sunshade for a lounge chair on the beach. The phone can continue to charge from the reserve battery power even after the sunshade is detached from the lounge chair, and while it is moved to a different lounge chair.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 1H and 1I show embodiments where the umbrella pole has a multiple-pole cantilever shape.

FIG. 3A shows an enlarged view of a specific embodiment of a cap of the umbrella to which the solar panels are hinge coupled.

FIG. 3B shows another specific embodiment of a cap of the umbrella.

FIG. 13 shows an image of an environment where embodiments of the present invention may be used by a user for charging one or more portable electronic devices.

DETAILED DESCRIPTION OF THE INVENTION

Figure 1A:
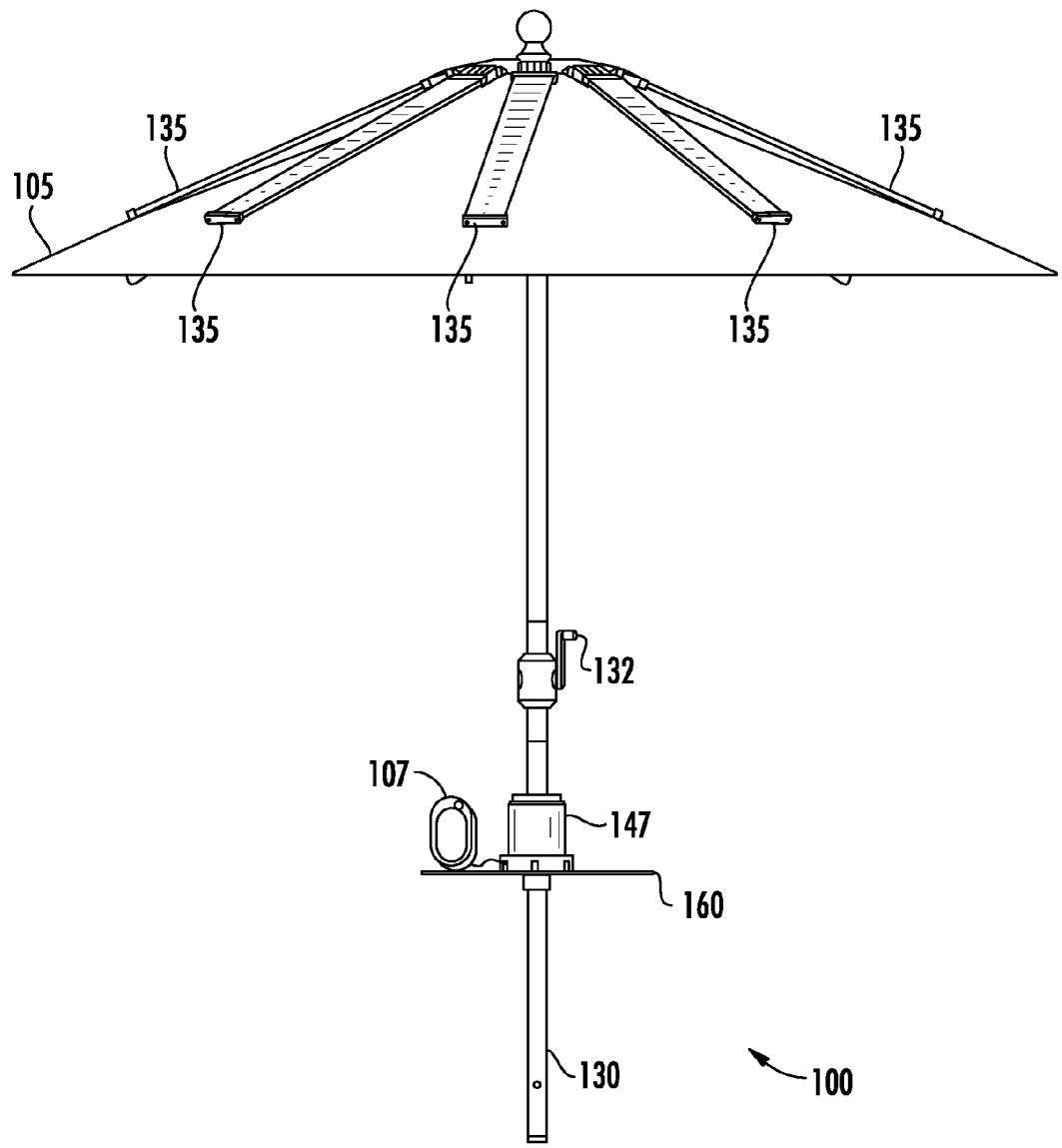
FIG. 1A shows a front view of an umbrella according to one embodiment.
Figure 1B:
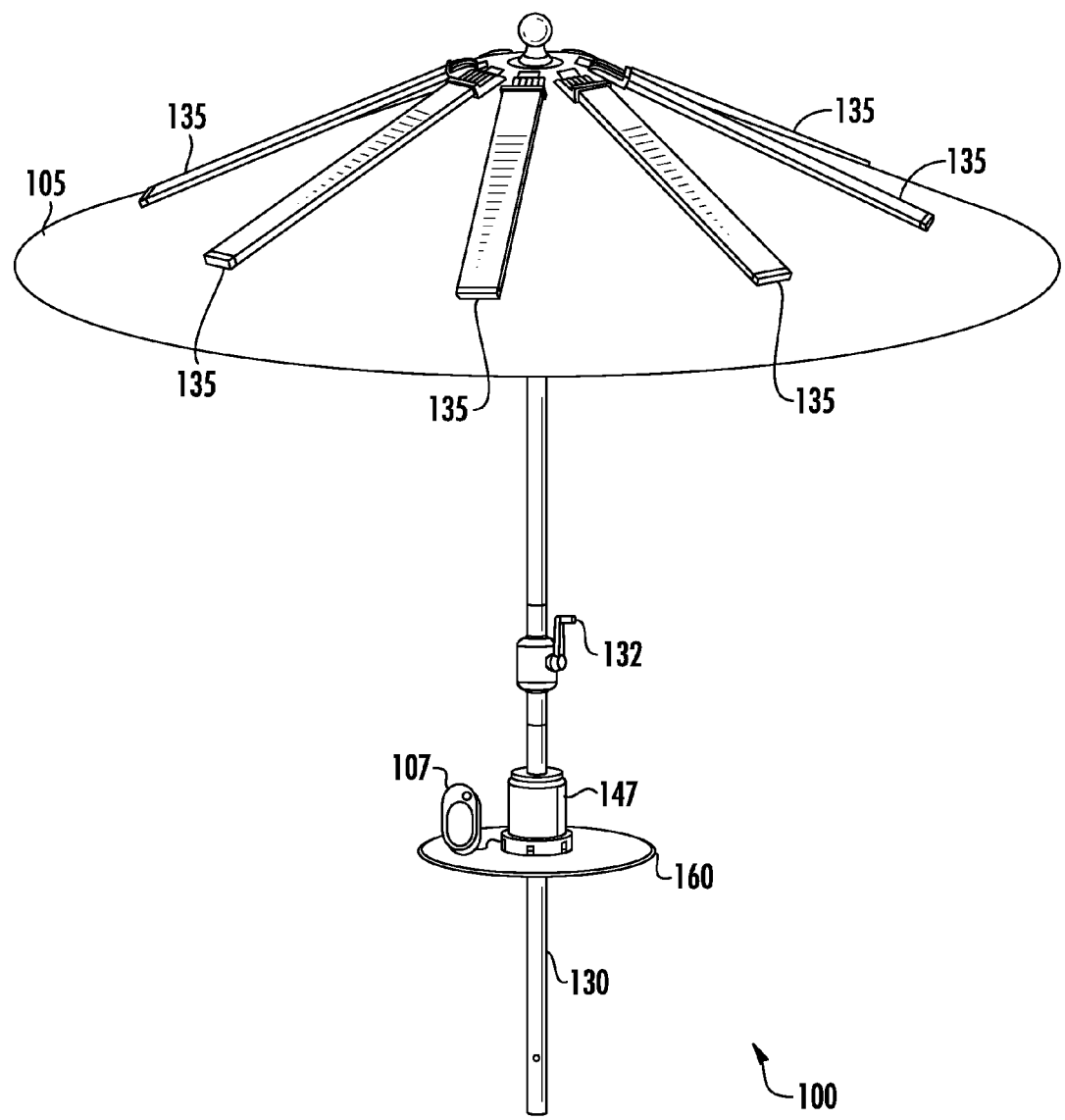
FIG. 1B shows a perspective view of the umbrella.
Figure 1C:
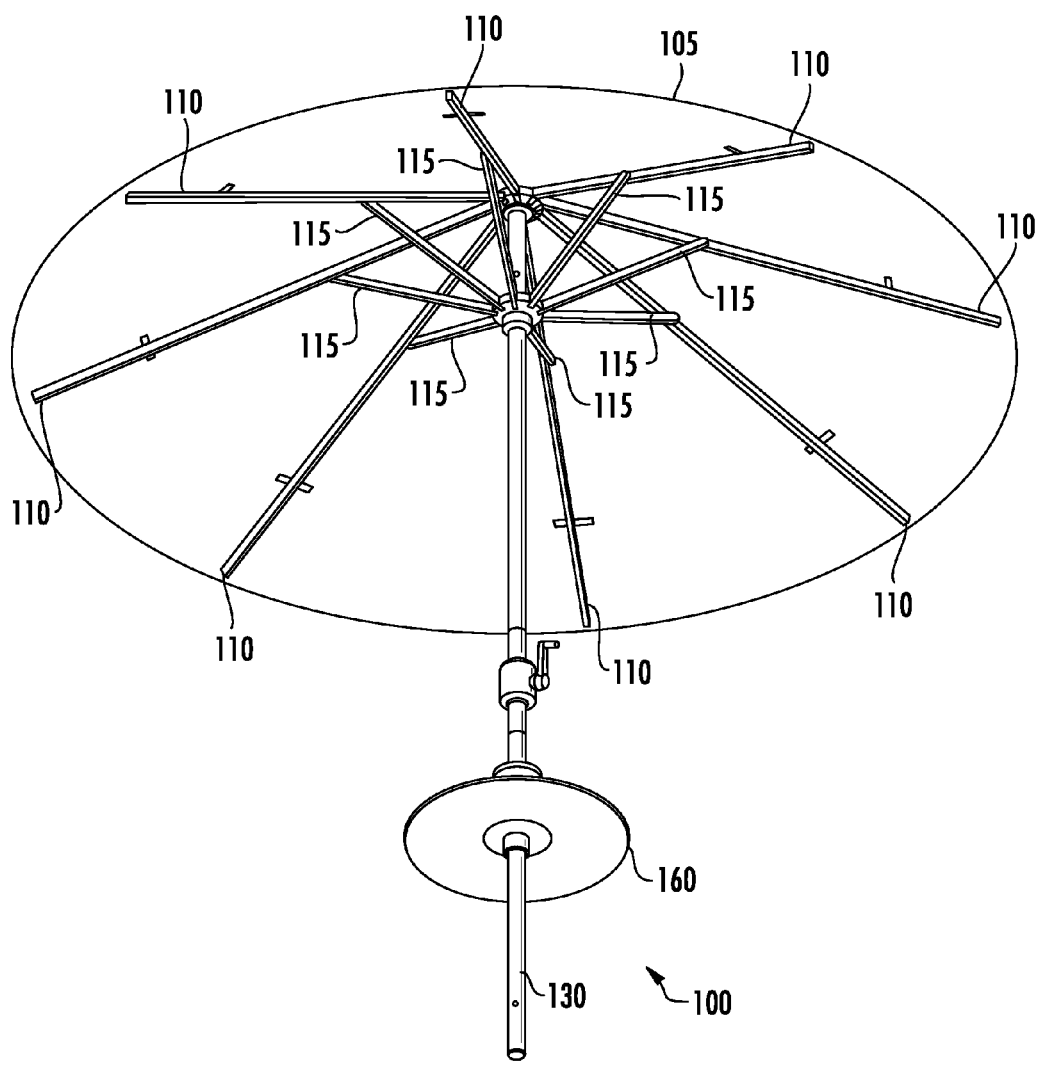
FIGS. 1C and 1D show underside views of the umbrella.
Figure 1D:
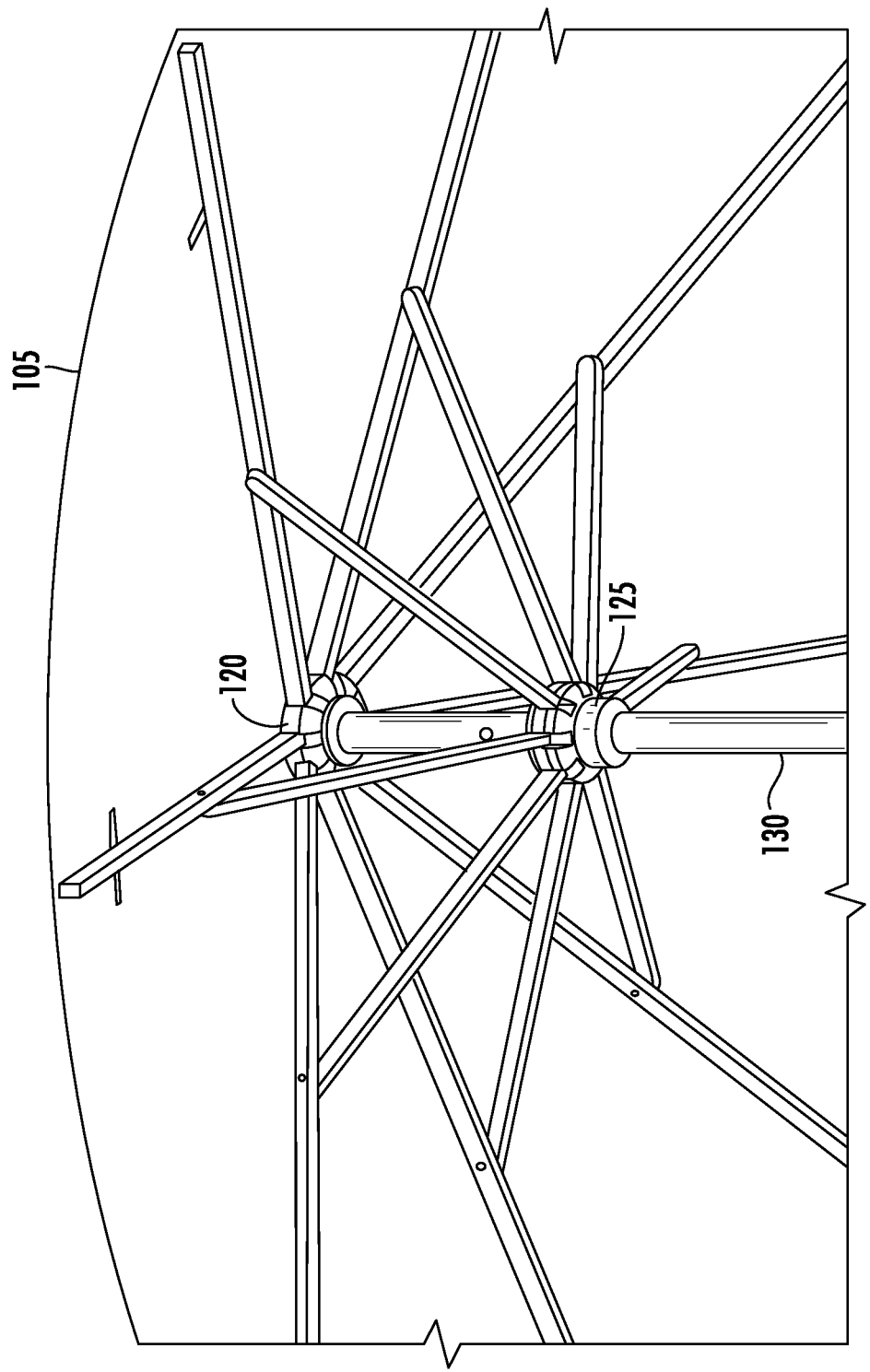

FIGS. 1A, 1B, and 1C respectively show a front view, a perspective view, and an underside view of an umbrella 100 according to one embodiment. FIG. 1D shows a further enlarged underside view of umbrella 100. Umbrella 100 is configured to protect a user from light (e.g., sunlight), collect the light, then convert the light into electricity, and use the electricity to power or charge one or more connected portable electronic devices 107. Light collection, conversion, and charging are described further below after various mechanical elements of umbrella 100 are described.

Figure 1E:
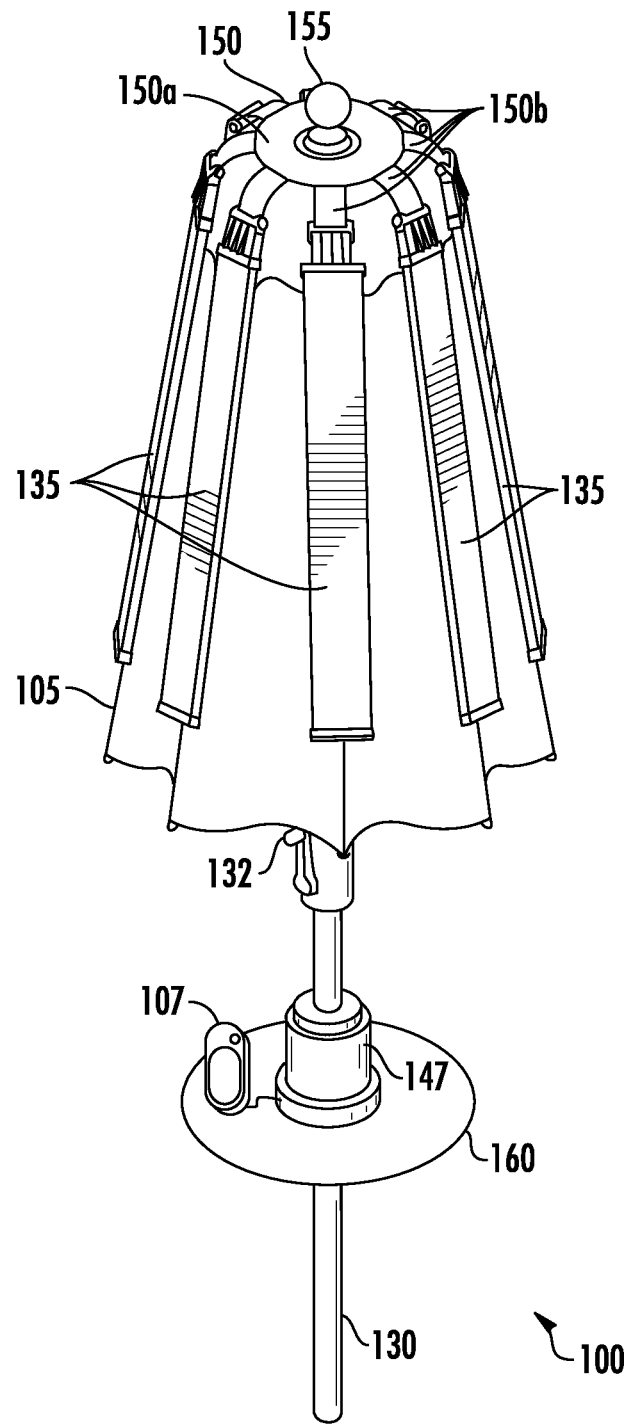
FIG. 1E shows a simplified image of the umbrella in a folded configuration.

Umbrella 100 may include a shade 105, a number of struts 110 (e.g., 8 struts), a number of ribs 115 (e.g., 8 ribs or spines), a first hub 120, and a second hub 125. Shade 105 may be attached to struts 110, which in-turn may be hinge coupled to first hub 120 at an end of each strut. Umbrella 100 may include one or more of these elements in any combination. Ribs 115 are respectively coupled to struts 110 along a length of the struts and are hinge coupled to second hub 125. First hub 120 and second hub 125 each have central apertures formed therein in which an umbrella pole 130 may be positioned. Second hub 125 may be configured to slide up and down along umbrella pole 130 to rotate struts 110 and ribs 115 upward and downward for opening and closing (also sometimes referred to as unfolding and folding) shade 105 in a conventional manner. Umbrella 100 may include a crank 132 on umbrella pole 130 that connects to second hub 125 via a cord or the like (not shown) for sliding second hub 125 up or down along umbrella pole 130 to open or close shade 105. FIG. 1E is a simplified image of umbrella 100 in a folded configuration with shade 105, struts 110, and ribs 115 folded downward in a closed position, and second hub 125 moved to a downward position along umbrella pole 130 to effect the folding. Struts 110, ribs 115, first hub 120, and second hub 125 are sometimes referred to as the foldable frame structure of umbrella 100.

Shade 105 is shown in FIGS. 1A-1D and being substantially round as viewed from the top of the shade. Shade 105 may have a variety of other shapes such as square, rectangular, pentagonal, hexagonal, heptagonal, octagonal, or the like. The number of struts and the number of ribs that umbrella 100 includes may match the number of sides of shade 105. For example, for a square shaded embodiment, umbrella 100 might have 4 struts and 4 ribs; for a pentagonal shaded embodiment, the umbrella might have 5 struts and 5 ribs; for a hexagonal shaded embodiment, the umbrella can have 6 struts and 6 ribs, and so forth. Struts 110 and ribs 115 may be made of a variety of materials, such as wood, plastic, fiberglass, steel, aluminum, or the like, or a combination of one or more of these materials. The dimensions of the shade can vary depending on the shape. For example, a round, hexagonal or octagonal shade can have a diameter of about 4, 5, 6, 7, 8, 9, 10, 11 feet or greater when the shade is fully extended. A square or rectangular umbrella can have a width of about 3, 4, 5, 6, 7, 8, 9, 10, 11 feet or greater when the shade is fully extended.

In various specific implementations, an umbrella with 8 struts (or spines) can have a 9-foot diameter shade (or 11-foot diameter shade). An umbrella with 6 struts (or spines) can have a 7-foot diameter shade (or 8-foot diameter shade). For example, the umbrella with 8 spines can have about a 9-foot diameter shade (e.g., from 7- to 11-foot shade) with 8 solar panels, each associated with a spine, each panel being about 30 inches long by 3.5 inches wide. Each panel has 3 photovoltaic cells of 10 inches long by 3 inches wide. Each photovoltaic cell can produce up to about 12 volts at 750 milliamps, depending on the sunlight. The three photovoltaic cells for a panel are insert into a clear housing to hold them together and protect them. So in such a configuration, a 9- to 11-foot umbrella can support 24 cells, yielding a maximum current of about 6 amps at 12 volts. This charges a rechargeable battery having about 22,000 milliamp-hour capacity. The rechargeable battery is connected, through a printed circuit board including circuitry discussed below, to supply power to three charging terminals (e.g., three USB type A receptacle). For example, corresponding USB plugs can connect to these receptacles for charging of devices 107. Power is delivered from the rechargeable battery through the receptacles, through cables, connecting the receptacles to the devices. As the rechargeable battery becomes depleted, sun shining on the solar panels causes the generation of electricity, which via circuitry on the printed circuit board to charge the rechargeable battery.

Figure 1F:
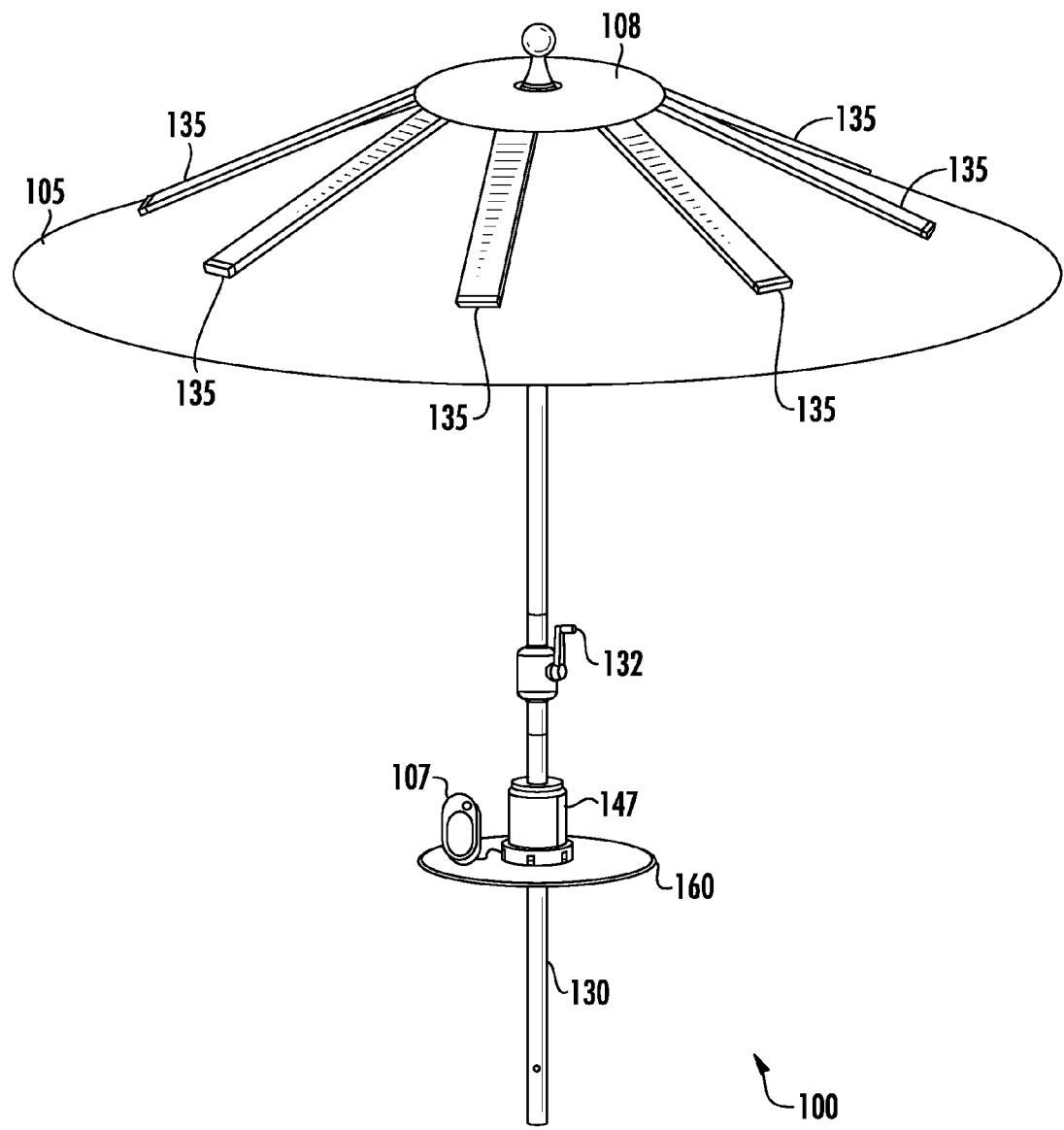
FIG. 1F shows a simplified image of the umbrella with a vent layer positioned at a top-central portion of the shade.

Shade 105 may also include a skirt (sometimes referred to as an overhang) that hangs down from a side of the shade. A skirt of shade 105 may hang down from the shade from about 2 inches to about 9 inches, although skirts of other widths might be used with relatively large umbrellas. Umbrella 10 may also include a vent layer 107 (e.g., formed from the same material that forms shade 105) that is positioned above a central portion of the shade (see FIG. 1F). Shade 105 may have a cutout in the material forming the shade (e.g., canvas (e.g., cotton), plastic, nylon, mylar, vinyl, polyester, olefin, acrylic, or the like) under vent layer 107 so that air moving across the top of shade 105 can move under vent 107 and move down through the cutout and so that air moving under the shade can similarly move under the vent layer and move up through the cutout.

Figure 1G:
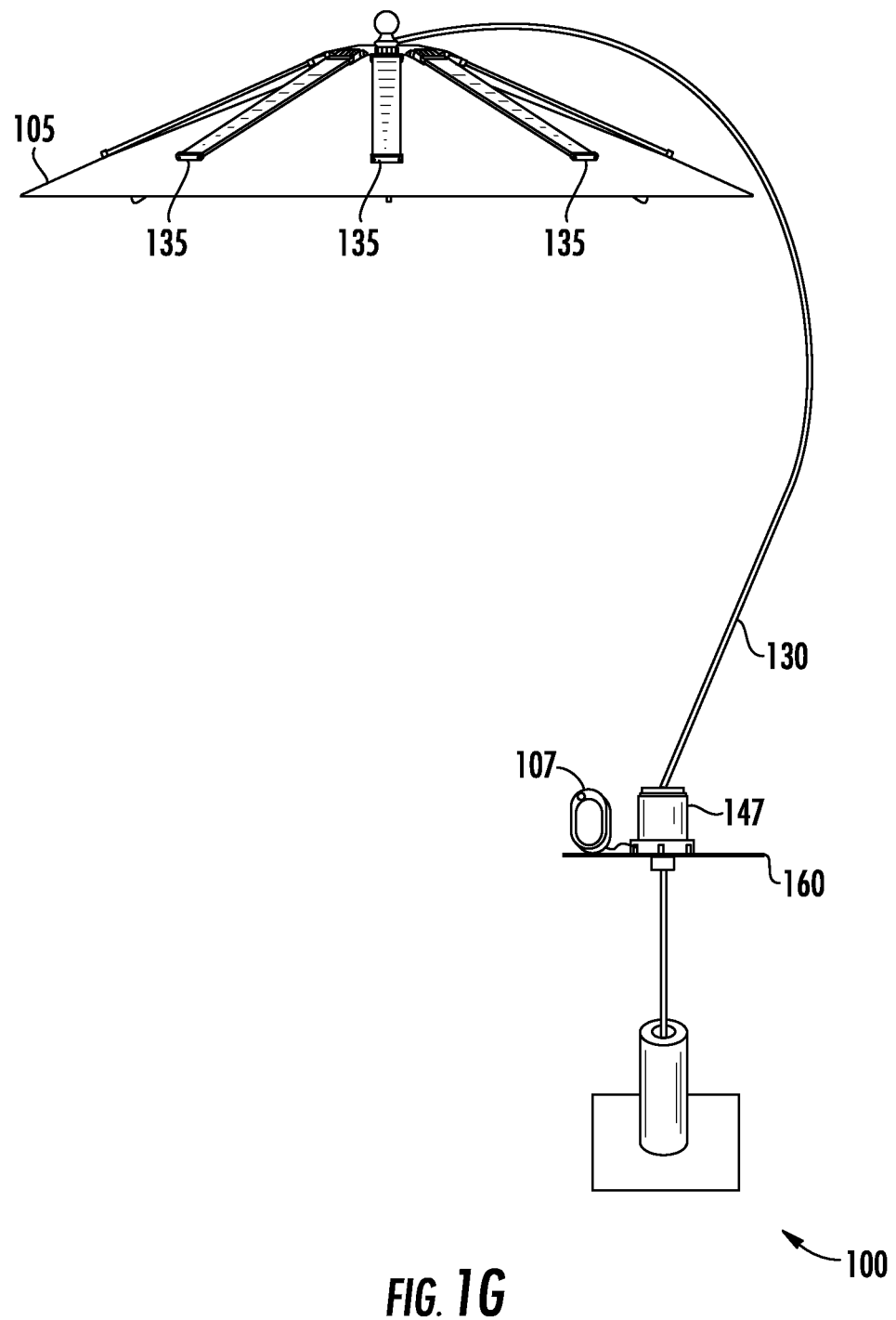
FIG. 1G shows an embodiment where the umbrella pole has a capricious-cantilever shape.
Figure 1H:
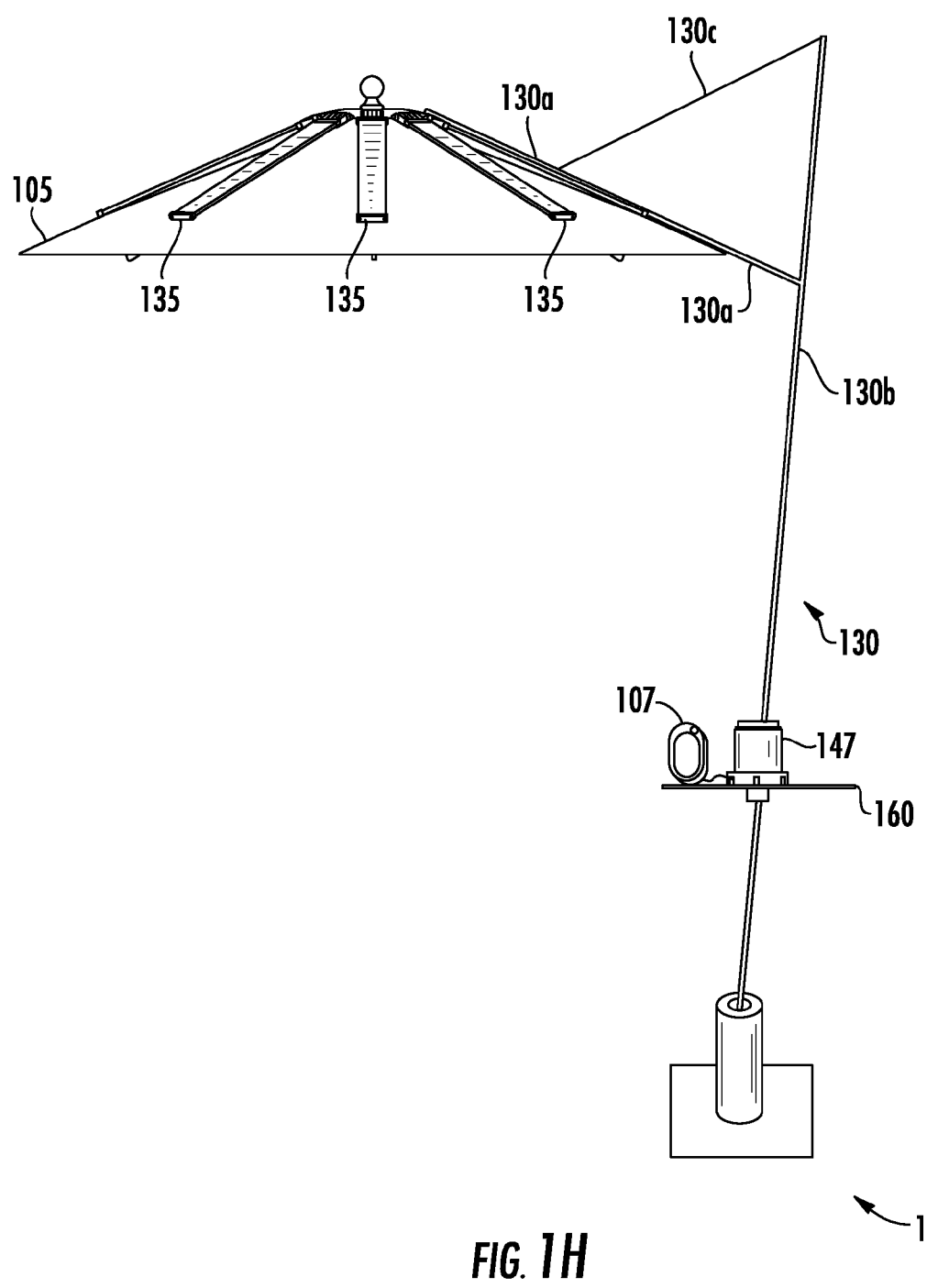
Figure 11:
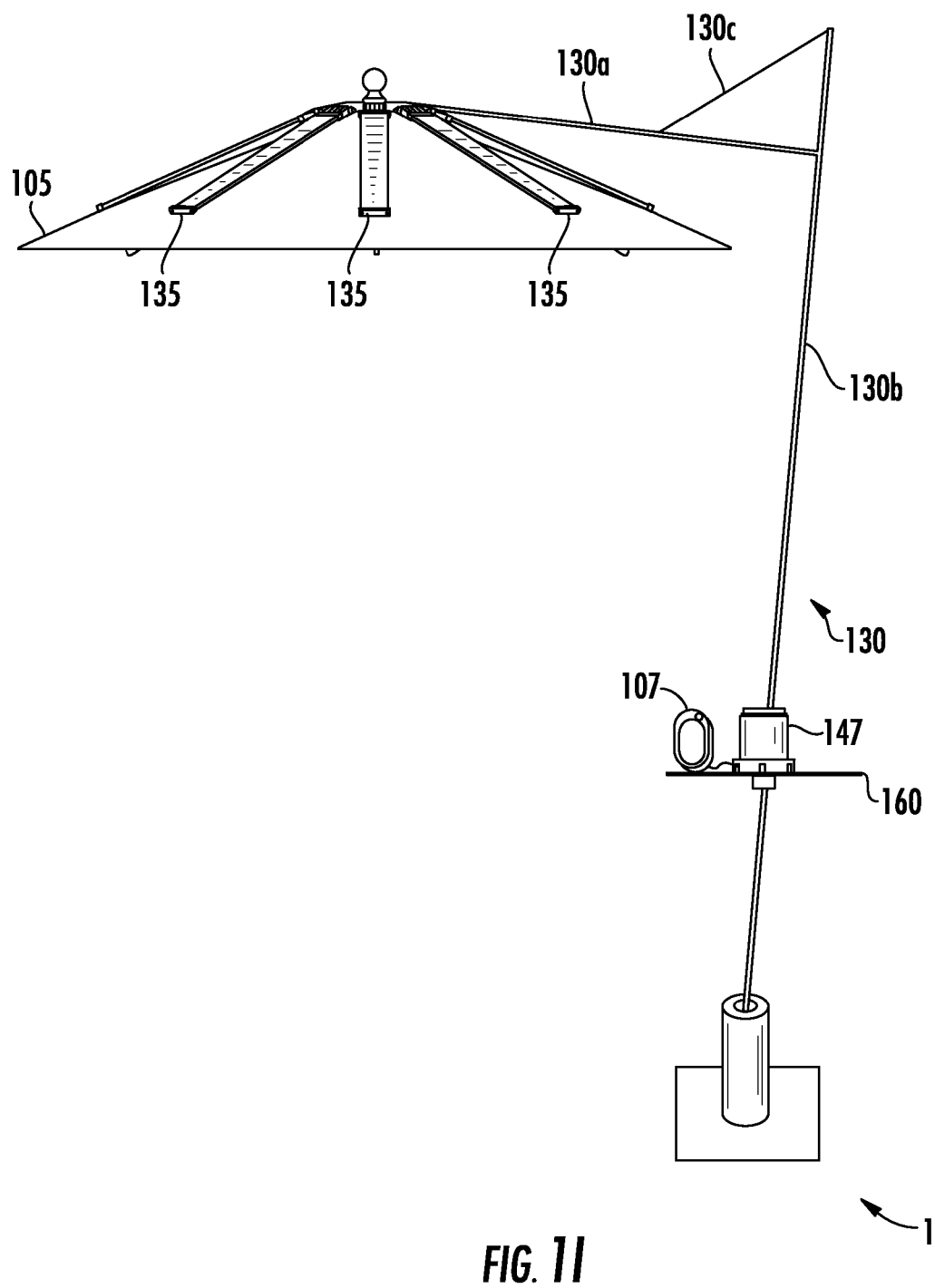
FIGS. 11A, 11B, and 11C show simplified side views, top view, and back views, respectively of specific embodiment of the invention incorporated in a chaise lounge.

Umbrella pole 130 is shown in FIGS. 1A-1F as being relatively straight and configured to be relatively vertically oriented when umbrella 100 is in use. In alternative embodiments, umbrella pole 130 may have a variety shapes, such as the capricious-cantilever shape shown in FIG. 1G, the multiple-pole cantilever shapes shown in FIGS. 1H and 1I, or the like. In the embodiments where umbrella pole 130 has a multiple-pole cantilever shape, a cantilever arm 130a of the umbrella pole may be attached (FIG. 1H) to the foldable frame structure of the umbrella, such as attached to one of struts 110, or detached from foldable frame structure. Cantilever arm 130a may be cantilever attached to a stand pole 130b and may have additional support from a truss pole 130c.

Figure 2:
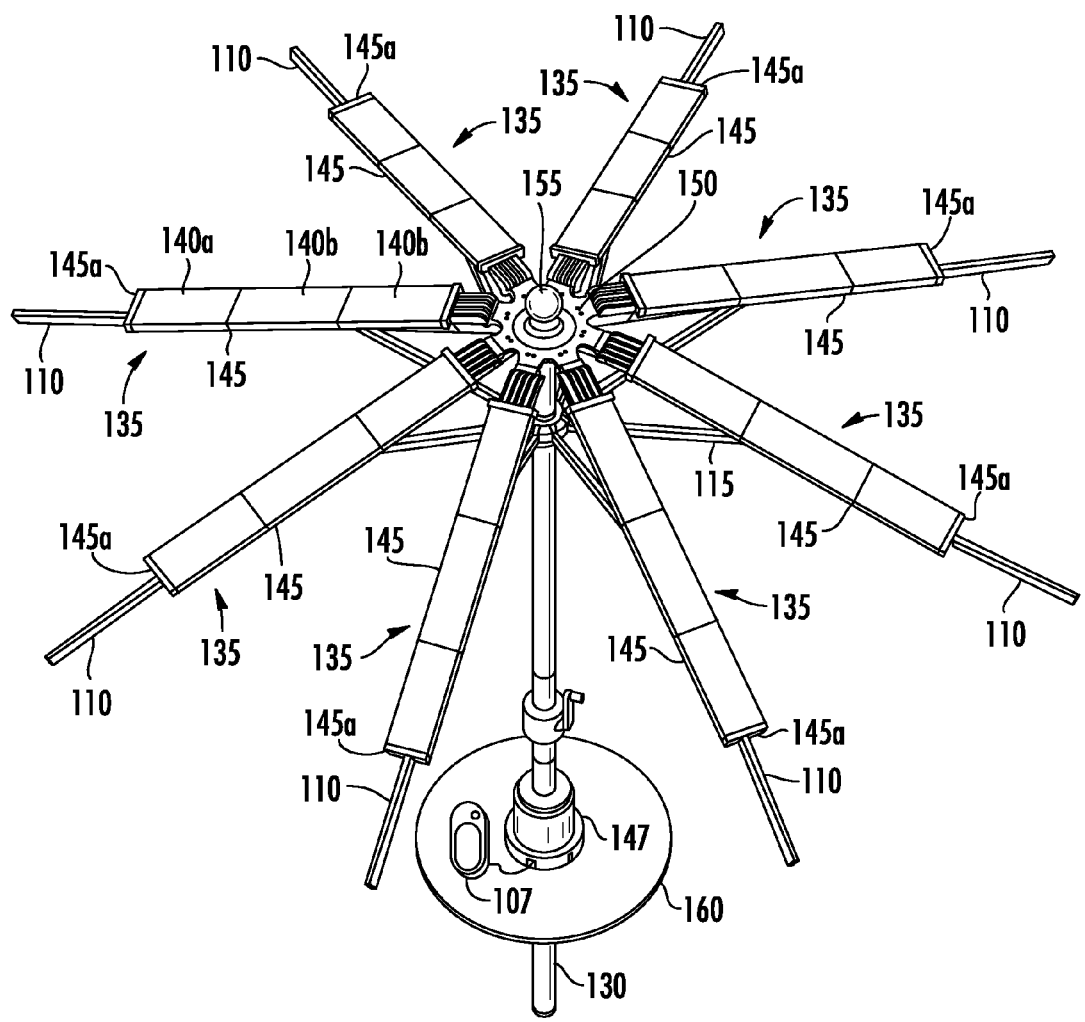
FIG. 2 shows a top view of the umbrella where the umbrella is shown without the shade.

FIG. 2 is a top view of umbrella 100 that is shown without shade 105. As shown in FIG. 2 and other figures, umbrella 100 further includes one or more solar panels 135. Each solar panel 135 may include three photovoltaic cells 140a, 140b, and 140c (generally photovoltaic cells 140) and a housing 145 that houses the photovoltaic cells. While each solar panel 135 is described as including three photovoltaic cells, each solar panel may include more or fewer photovoltaic cells. Each housing 145 may be a sleeve in which photovoltaic cells 140a-140c are housed. Each housing 145 may be formed from a variety of materials such as plastic, nylon, metal (e.g., aluminum), or the like, or any combination of these materials. Further, each housing 145 is attached to one of struts 110. For example, each housing 145 may be attached to one of struts 145 at a first end portion 145a of housing 145. Various clasps, brackets, or the like may attach housings 145 to struts 110. With solar panels 135 attached to struts 110 at the top of umbrella 100, the solar panels are positioned to collect a relatively large amount of light that falls on the umbrella for conversion to electrical energy.

Each photovoltaic cell 140 may be approximately 9 to 11 inches long (e.g., 10 inches long) and approximately 2.5 to 3.5 inches wide (e.g., 3 inches wide). Each set of three photovoltaic cells on each strut 110 may be configured to generate approximately 500 milliamps to approximately 1000 milliamps (e.g., 750 milliamps) at approximately 10 volts to 14 volts (e.g., 12 volts). The sets of three photovoltaic cells may be electrically parallel to provide approximately 4 amps to approximately 8 amps (e.g., 6 amps) at the described voltages. Various photovoltaic cell technology may be used for photovoltaic cells 140, such as single crystal silicon, polycrystalline silicon, polymer solar cells, organic solar cells, and other thin film technologies.

Umbrella Cap. Umbrella 100 may further include a cap 150 and a cap retainer 155 that connects cap 150 to a top of umbrella pole 130. Cap retainer 155 may be threaded or the like to umbrella pole 130. Cap 150 may be configured to be positioned above first hub 120 on umbrella pole 130.

FIG. 3A is an enlarged view of cap 150. Cap 150 may include a top portion 150a and a number of arms 150b (e.g., 8 arms that are respectively associated with ribs 115 and solar panels 135). Top portion 150a may be substantially flat and have a centrally positioned aperture 150e formed therein. Aperture 150e may be configured to receive a fastener, such as a bolt of umbrella pole 130 or cap retainer 155 for attaching cap 150 to the umbrella pole.

Each arm 150b may be connected to top portion 150a and may be curved and may extend downward from the top portion 150. Specifically, each arm 150b may extend in a curved manner downward from a side of top portion 150a. Top portion 150a and arms 150b may be integrally formed of metal, such as steel, aluminum, or the like. Alternatively, arms 150b may be attached to top portion 150 via fasteners, such as nuts and bolts.

Cap 150 may further have a number of apertures 150f formed in top portion 150a. The apertures may be formed in pairs 150g and each pair may be positioned adjacent to the ends of arms 150b that are nearest to top portion 150a. Apertures 150f may be configured to receive fasteners (e.g., bolts, screws, rivets, pins, or the like) or the like for attaching cap 150 to struts 110 via brackets or the like. Aperture 150f may be threaded or may have attached nuts or the like, which may be threaded. In various alternative embodiments, top portion 150a may include a variety of other devices for attaching cap 150 to struts 110, such as studs, threaded studs, or the like which may extend downward from the top portions for receiving various fasteners.

An end portion 150c of each arm 150b may be hinge attached to end portions 145b of each housing 145. Each end portion 145b of each housing 145 is removably attached to an elongated portion 145c of the housing where the elongated portions of the housings house photovoltaic cells 140. Providing for the elongated portion 145c of each arm 145 to removably attach to end portion 145b allows the elongated portions of the arms to be relatively easily removed from the umbrella for relatively easy replacement of photovoltaic cells 140 should one or more of the photovoltaic cells fail.

According to a specific embodiment, each end portion 150c of each arm 150b may include a hinge part, such as an elongated barrel, which is configured to receive a pin 150d that can rotate inside of the elongated barrel. Pins 150d may be longer than the barrels and extend from the ends of barrels so that the ends of the pins may be attached to end portions 145b of housings 145 to provide for the rotation of the housings with respect to arms 150b. According to a further specific embodiment, each end portion 145b of each housing 145 includes a front hinge plate 145d and a back hinge plate 145e, which are configured to attach to one another and rotationally couple to the ends of pins 150d. The rotational coupling of front and back hinge plates 145d and 145e to each pin 150d allows housings 145 to rotationally raise and lower as the umbrella opens and closes. The curve of each arm 150b provides flex for housings 145 as the housings raise and lower to inhibit the housing from experiencing forces that might separate the housing from the arms by allowing some lateral movement of the housings along the struts.

Figure 8:
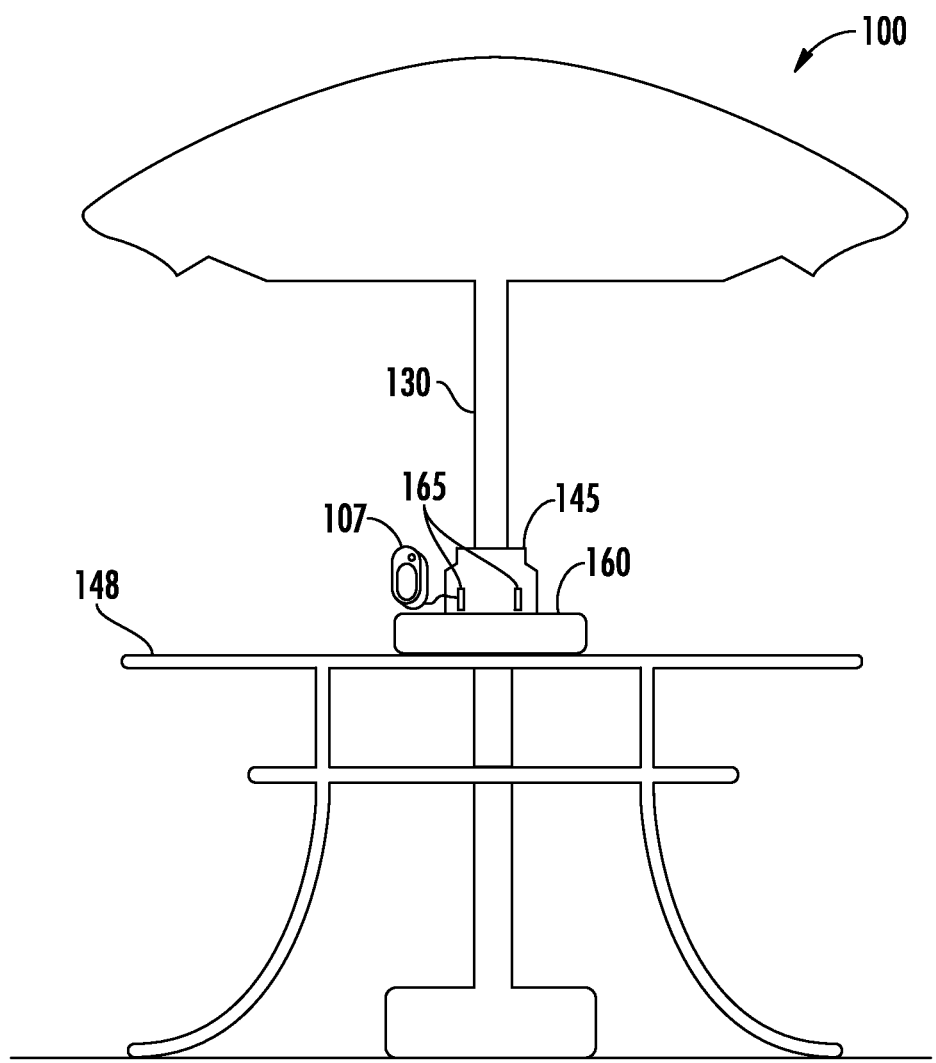
FIG. 8 shows a simplified image of an umbrella according to one embodiment inserted into an outdoor table.

One or both of front and back hinge plates 145d and 145e may include electrical contacts 145f and 145g that are configured to mechanically and electrically couple to corresponding electrical contacts (not shown) of elongated portion 145c. The electrical contacts in the hinge plates and the electrical contacts in the elongated portions of the housings allow generated current to flow out from the photovoltaic cells. A pair of wires (not shown) may be electrically connected to the electrical contacts and run down the center of umbrella pole 130 for delivering the generated current to a circuit (described below with respect to FIG. 8), which is configured for connecting to and charging one or more portable electronic devices 107.

FIG. 3B shows a specific implementation of an alternative design for a cap for the umbrella. Relative to the cap described above in FIG. 3A, each arm 150b can have less curvature at a proximate end where each arm connects with the top portion 150a. Toward a distal end of each arm, closer to each end portion, the arm can have a bend 150h. The bend can be a sharp bend or a gradual bend. For example, an angle α of the bend can be about 90 degrees. In other implementations, the angle can be less sharp. For example, the bend can have an angle of 91, 92, 93, 94, 95, 96, 97, 98, 99, 100, 105, 110, 115, 120, 125, 130, 135, 140, 145, 150, or 155 degrees, or any angle in this range or greater. In other implementations, the angle may be less than 90 degrees.

In this specific implementation in FIG. 3B, similar to the cap discussed above in FIG. 3A, the end portion 150c of each arm 150b may include a hinge part, such as an elongated barrel, which is configured to receive a pin 150d that can rotate inside of the elongated barrel.

Figure 4:
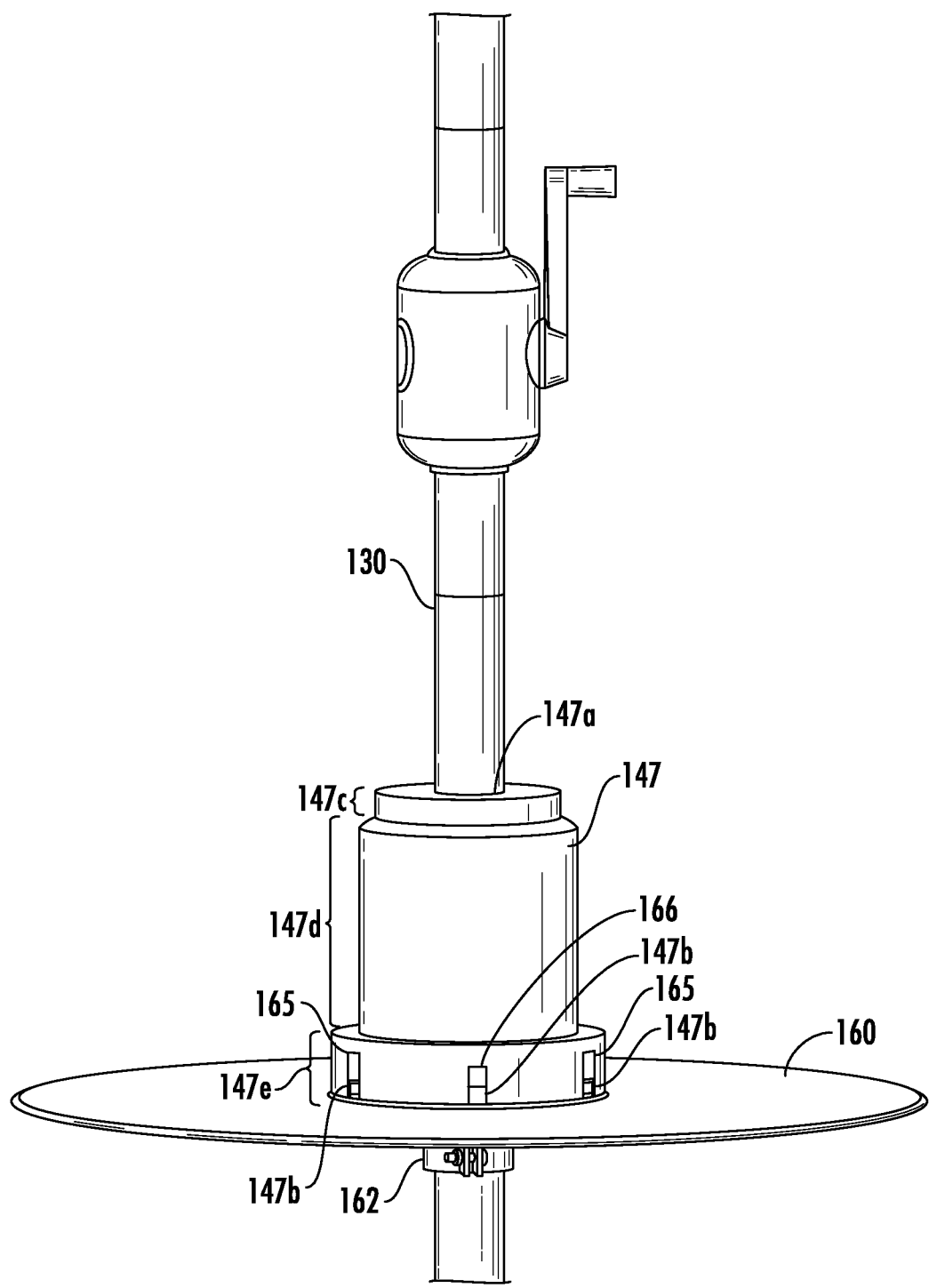
FIG. 4 shows a simplified perspective view of a central portion of the umbrella.

Central Portion of Umbrella. FIG. 4 is a simplified perspective view of a central portion of umbrella 100. The central portion of the umbrella may include a battery housing 147 configured to house the circuit briefly described above. Battery housing 147 may have a central aperture 147a formed therein (e.g., formed in a top of the battery housing) where the central aperture is configured to receive umbrella pole 130 so that the umbrella pole is oriented longitudinally (from top to bottom) through the battery housing.

Battery housing 147 may be disposed above or on a shelf 160 on which one or more portable electronic devices 107 may be placed for charging. Battery housing 147 further has a number of apertures 147b formed therein that provide access to one or more charging terminals 165 (e.g., three charging terminals). Charging terminals 165 are described below.

Battery housing 147 provides protection for various components (electronic components, batteries, and the like described below) positioned within the battery housing from exposure to environmental elements (e.g., extreme sunlight, heat, rain, humidity, and wind) that can damage and reduce the life of these components. Battery housing not only protects the components disposed in the battery housing, but also protects users from contacting these components (e.g., inhibits users from touching electrical wires, batteries, and the like). Battery housing 147 provides the additional advantage of providing an aesthetically pleasing appearance by removing from sight these various components. The battery housing may include a number of cylindrical sections 147c, 147d, 147e, where the cylindrical sections have increasing diameters downward along the battery housing. Middle section 165c might be configured to house a battery. Bottom section 165d might be configured to house various electronic components and house charging terminals 165.

According to one embodiment, apertures may be formed in battery housing 147 wherein each aperture is positioned adjacent to one of openings 147b. Each aperture may be configured to permit a signal (e.g., light) from an indicator (e.g., one or more LEDs) to pass through the aperture to indicate whether a portable electronic device 107 that is connected to an adjacent charging terminal is charging or charged. For example, each indicator may emit yellow light to indicate that a connected portable electronic device 107 is charging, and emit green light to indicate that the connected portable electronic device is charged. The indicators may be positioned behind the apertures or in the apertures and may be mounted on PCB 175. The indicators may be controlled by control circuit 230 to indicate whether a connected portable electronic device is charging or charged.

Figure 5A:
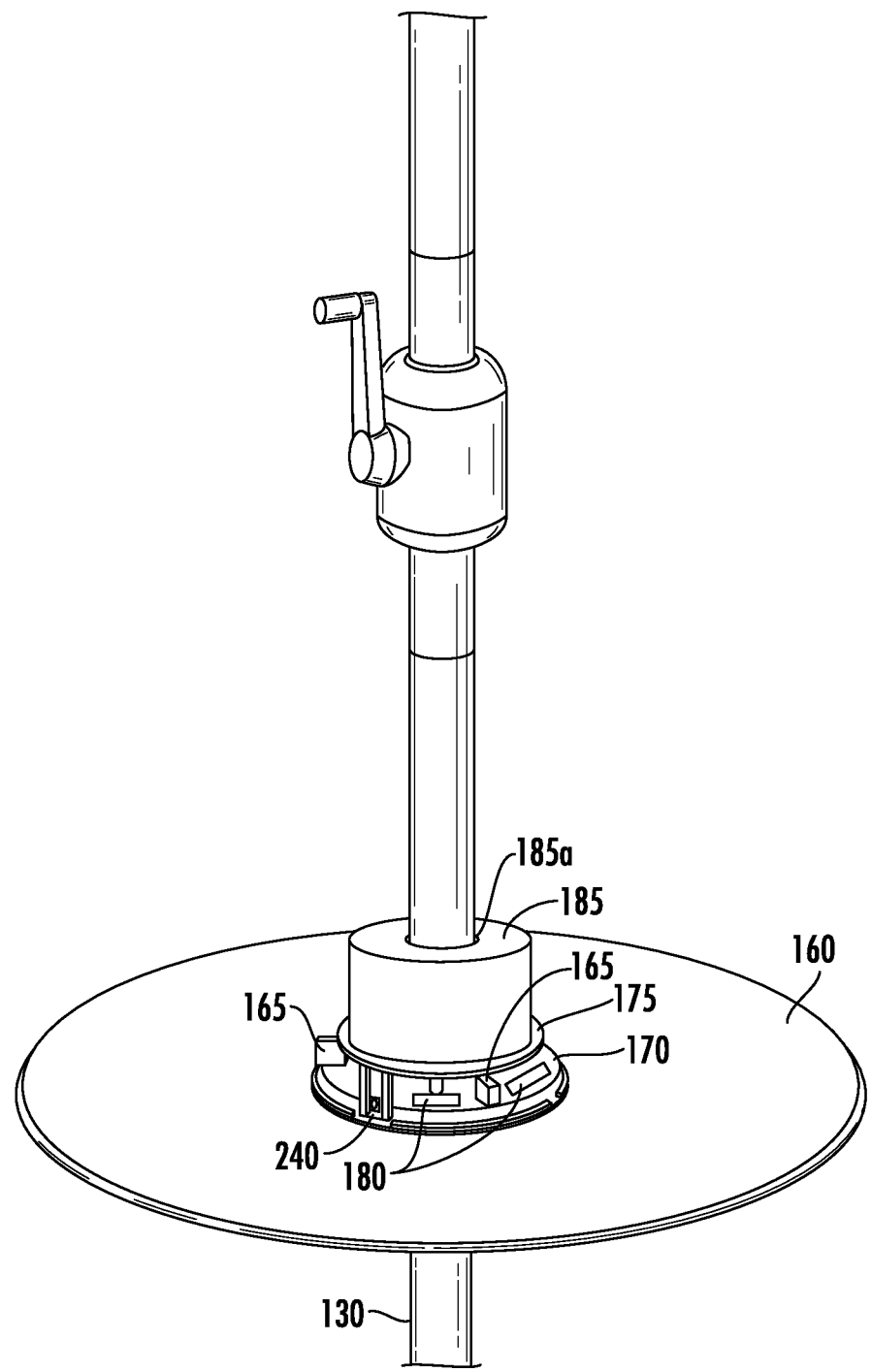
FIG. 5A shows a simplified perspective view of the central portion of the umbrella with a battery housing for the printed circuit board and battery removed.

FIG. 5A is a simplified perspective view of the central portion of umbrella 100 with battery housing 147 removed. Battery housing 147 houses a printed circuit board 170 (PCB) and a battery shelf 175. PCB 170 includes the circuit briefly described below and identified by reference numeral 180. Circuit 180 is configured to receive electrical energy (voltage and current) from solar panels 135. Circuit 180 may include various electronic components (described below) to condition the current, the voltage, or both, which are received from solar panels 135 and supply the conditioned voltage and current to a battery 185 (e.g., a rechargeable battery) for energy storage therein. According to one embodiment, battery 185 is separated from circuit 180 via battery shelf 175 on which the battery is configured to sit. One or more electrical traces or wires may couple battery 185 to circuit 180. Battery shelf 175 may include one or more apertures formed therein for routing the traces or wires.

Battery 185 may be cylindrical, round, rod shaped or the like. As shown in FIG. 5A, battery 185 may be cylindrically shaped and have an aperture 185a located in a central portion of the battery where the aperture is configured to receive umbrella pole 130. The cylindrical shape of battery 185 allows the battery to occupy a substantially optimal amount of space in battery housing 147 and accordingly allows the battery to provide relatively high charge storage. For example, battery 185 may be configured to store 20,000 milliamp-hours or more of charge. According to one specific embodiment, battery 185 is a 22,000 milliamp-hour battery. Battery 185 may use a variety of battery chemistries, such as lithium ion, nickel cadmium, nickel metal hydride, or the like. Other battery sizes are possible, such as 5200 milliamp hours, 8600 milliamp hours, 10,000 milliamp hours, 15,000 milliamp hours, 25,000 milliamp hours, 30,000 milliamp hours, 50,000 milliamp hours, or 100,000 milliamp hours, or other values, or values smaller or less than these values.

Figure 5B:
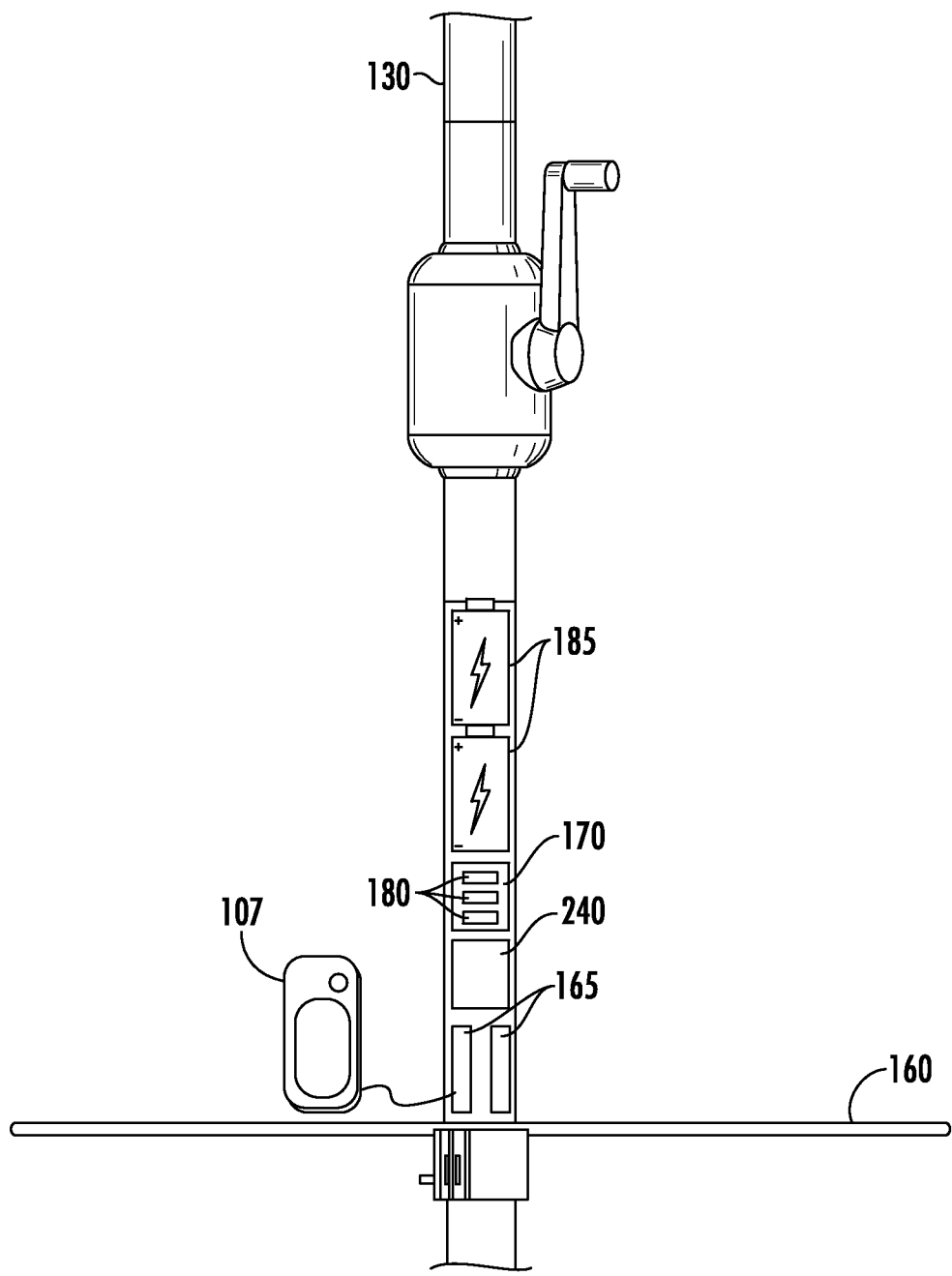
FIG. 5B shows a simplified schematic of an embodiment of the umbrella where the battery, the circuit, and one or more charging terminals are positioned within the umbrella pole of the umbrella.

In one alternative embodiment, one or more batteries 185 may be alternatively positioned in or on umbrella 100. For example, one or more batteries 185 may be positioned in umbrella pole 130, which may be hallow or have a compartment configured for storing the batteries. FIG. 5B is a simplified schematic of a central portion of umbrella 100 and umbrella pole 130 where one or more batteries 185 are positioned in the umbrella pole. In addition to one or more batteries 185 being positioned in umbrella pole 130, PCB 170, circuit 180, one or more charging terminals 165, and other circuit elements descried below may be positioned in the battery pole. Battery pole 130 may have a number of apertures formed therein where charging terminals 165 may be positioned for connecting to one or more portable electronic device 107 for being powered or charging. In some embodiments where additional electrical power may be used, one or more batteries may be positioned in battery housing 145, in umbrella pole 130, or at other locations on umbrella.

Figure 6:
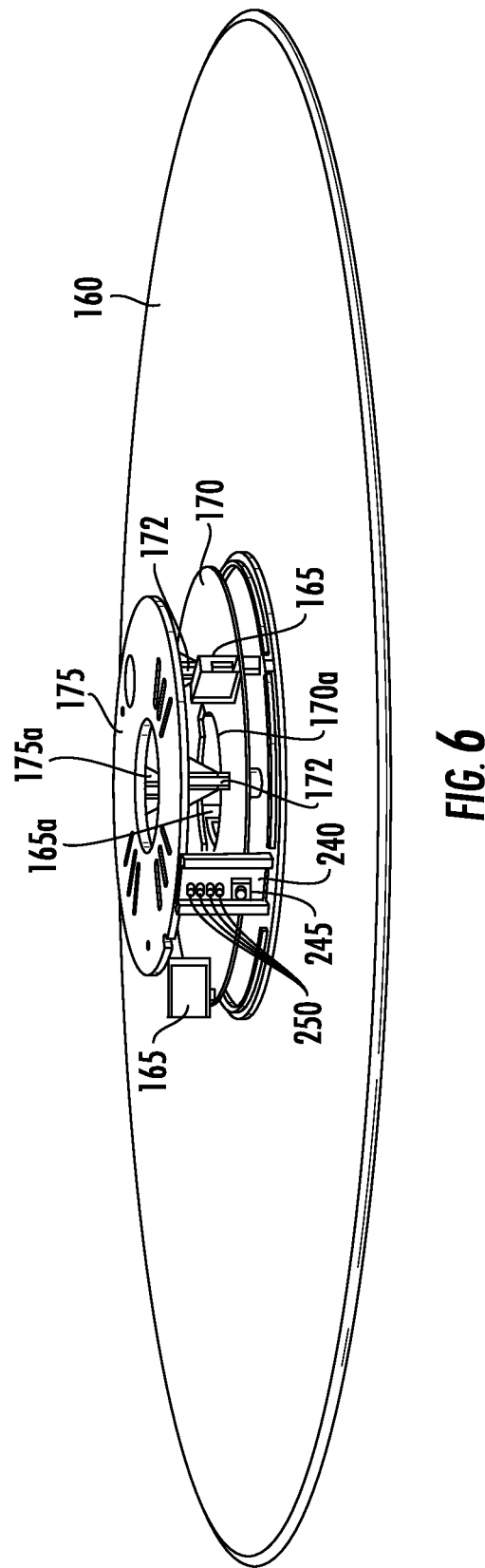
FIG. 6 shows a further enlarged view of the shelf, the printed circuit board, and the battery shelf.
Figure 7:
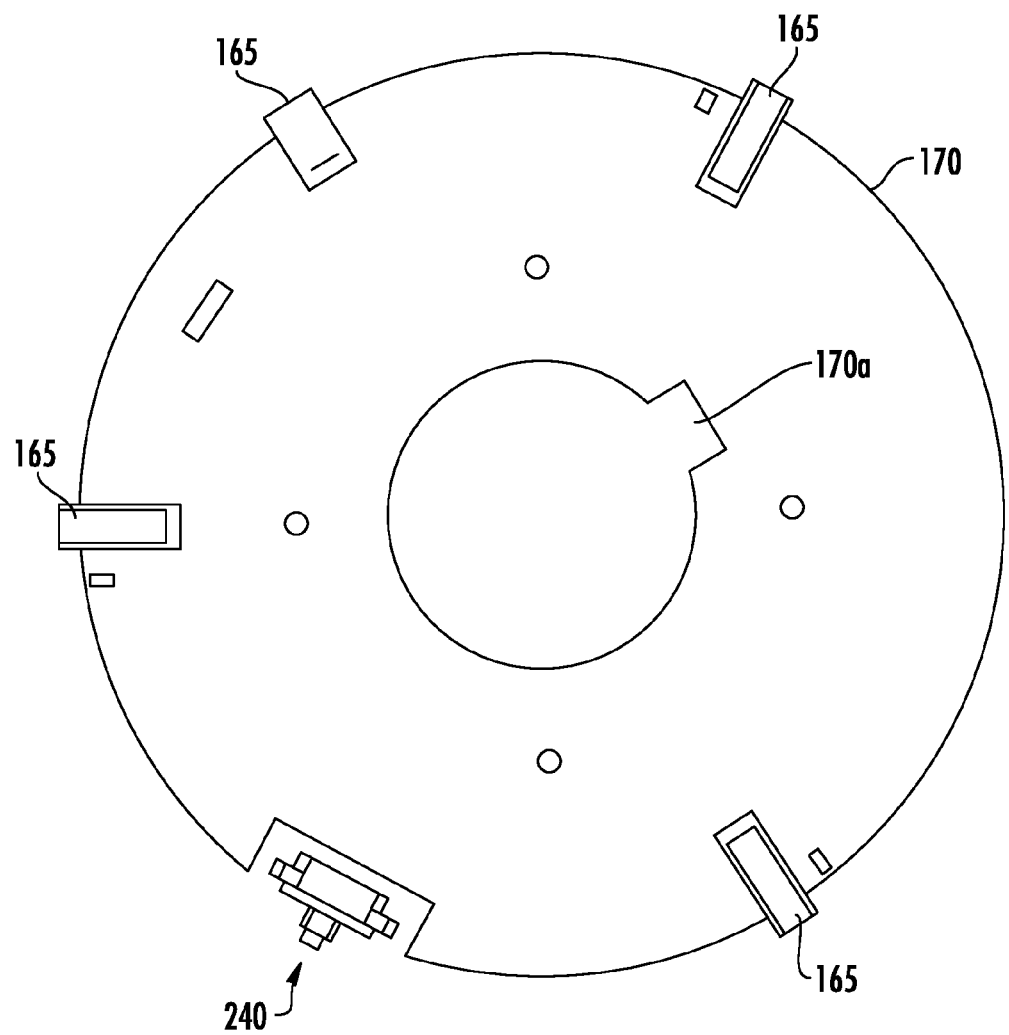
FIG. 7 shows a top view of the printed circuit board.

FIG. 6 provides a further enlarged view of shelf 160, PCB 170, and battery shelf 175, and FIG. 7 provides a top view of PCB 170. Central apertures are formed in shelf 160, PCB 170, and battery shelf 175 are respectively labeled with reference numbers 160a, 170a, and 175a. Each central aperture 160a, 170a, and 175a is configured to receive umbrella pole 130 so that shelf 160, circuit board 170, and battery shelf 175 may each be substantially centered on the umbrella pole providing a relatively symmetric and aesthetic design. Each of the central apertures 160a, 170a, and 175a may have diameters, such as about 1.75 inches to about 2.25 inches (e.g., 2 inches), for receiving umbrella pole 130, which may have a diameter of about 1.5 inches to about 2 inches. It is noted that while each of battery housing 147, shelf 160, circuit board 170, and battery shelf 175 are shown in FIGS. 5-7 as being generally round from a top view, one or more of the battery housing, the shelf, the circuit board, and the battery shelf may have alternative shapes such as square, rectangular, pentagonal, hexagonal, or the like. Moreover, while battery housing 147, shelf 160, circuit board 170, and battery shelf 175 are described and shown as including central apertures for receiving umbrella pole 130 therethrough, in alternative embodiments one or more of the battery housing, the shelf, the circuit board, and the battery shelf may not have the central apertures formed therein and might be configured to mount on a side of umbrella pole 130.

In a specific implementation, battery shelf 175 has a smaller diameter than PCB 170. For example, battery shelf 175 may have a diameter of about 5 inches to about 6 inches (e.g., 5.75 inches) and PCB 170 may have a diameter of about 6 inches to about 6.5 inches (e.g., 6.25 inches).

Shelf 160 may be mechanically attached to umbrella pole 130 via a bracket 162 (see FIG. 4) or the like that clamps to the umbrella pole and attaches to the shelf. PCB 170 may in-turn be attached to shelf 160 via a number of fasteners, clamps, or the like. Battery shelf 175 may be mounted on the PCB via a number of posts 172 (see FIG. 6) or the like, which positions the battery shelf above the PCB with a gap between the battery shelf and the PCB.

Figure 9:
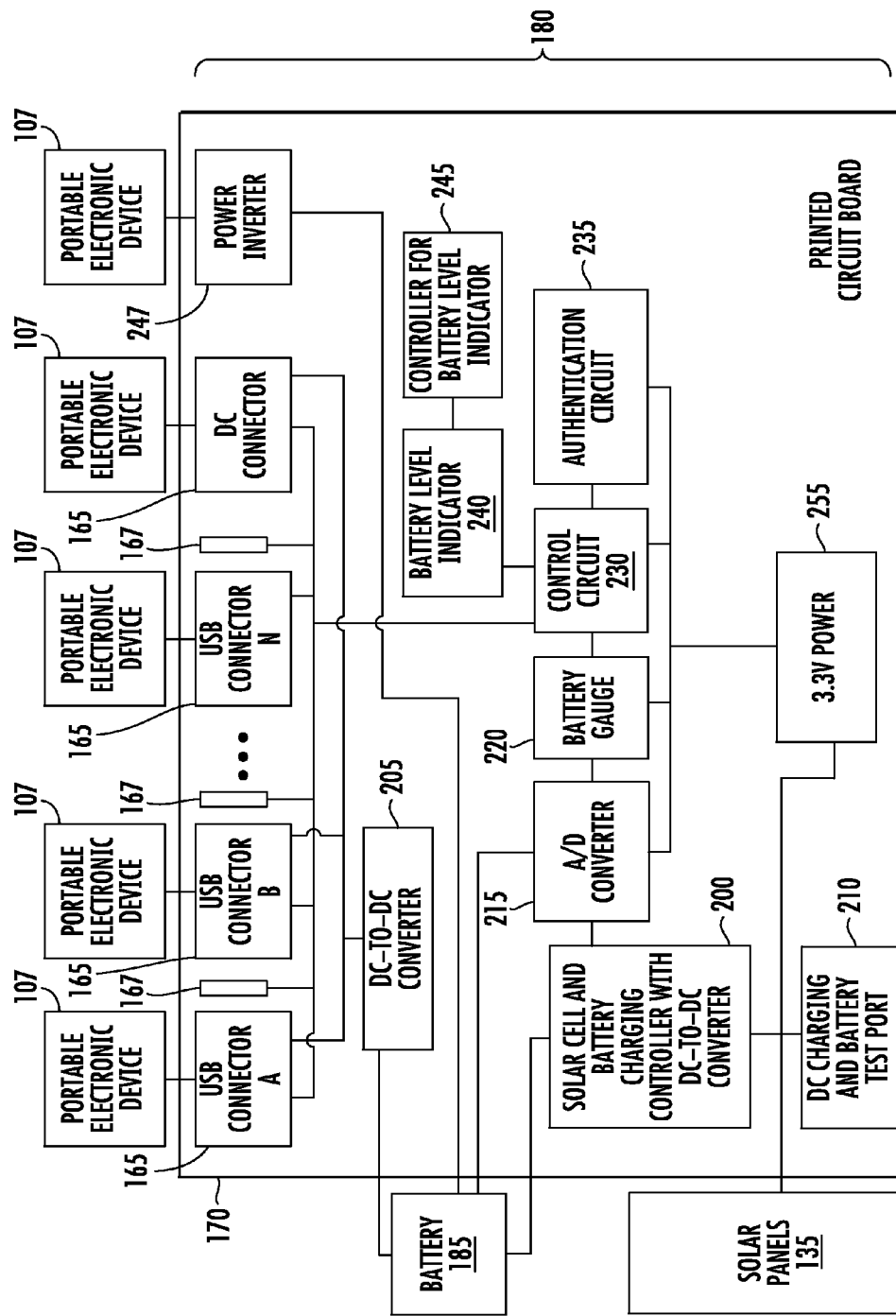
FIG. 9 shows a simplified block diagram of a circuit of the umbrella that may be mounted at least in part on the printed circuit board.

With battery housing 147, shelf 160, charging terminals 165, PCB 170, battery shelf 175, battery 185, and the like positioned at a central portion of umbrella pole 130, this positioning provides a convenient height for use by a user for charging and power devices while a user sits or stands near umbrella 100. For example, FIG. 9 shows an embodiment of umbrella 100 where the height of battery housing 147, shelf 160, charging terminals 165, PCB 170, battery shelf 175, battery 185 are positioned along umbrella pole 130 at about the height of a table top of an outdoor table 148 (e.g., a patio table, a picnic table, or the like).

Not only does the central location along battery pole 130 provide for convenient user for powering and charging device, the central location also provide for easy maintenance of these elements by maintenance technicians or the like.

Charging Circuit. FIG. 9 is a simplified block diagram of circuit 180, which is mounted at least in part on PCB 170. Circuit 180 implements the electronic functionality and electronic modes of the umbrella as briefly described above and described in further detail below. Circuit 180 may include the charging terminals 165, a solar-panel and battery-charging controller 200 (i.e., battery-charging controller), a DC-to-DC converter 205, a DC charging port 210, an analog-to-digital (A-to-D or ADC) converter 215, a battery gauge 220, a control circuit 230, an authentication circuit 235, a battery level indicator 240, an indicator controller 245 for the battery level indicator, and a power inverter 247. Circuit 180 may include all or a portion of the foregoing listed circuit elements in any combination.

According to one embodiment, solar panels 135 are electrically connected to battery-charging controller 200 and configured to supply generated voltage and current to the battery-charging controller. Battery-charging controller 200 may also be electrically connected to battery 185 and may convert the generated current, generated voltage, or both to levels used by battery 185 for charging. For example, battery-charging controller may include a DC-to-DC converter that may convert the charging voltage to about 4.2 volts to about 4.4 volts and may provide a suitable current for charging lithium ion battery chemistry.

Battery-charging controller 200 may further monitor the charge of battery 185 and manage the conditions for initiating charging, topping off charging, and stopping charging. Battery-charging controller 200 may be implemented using an integrated circuit manufactured, for example, by Texas Instruments, Linear Technology Corporation, Maxim Integrated Products, Incorporated, or National Semiconductor Corporation. For example, battery-charging controller 200 may be the TI BQ24650 circuit of Texas Instruments, which is referred to by the manufacturer as a "High Efficiency Synchronous Switch-Mode Charger Controller-Solar Battery Charger."

Battery 185 may alternatively be charged via DC charging port 210. A DC voltage applied to DC charging port 210 may be routed through battery-charging controller 200 for charging the battery. Battery-charging controller may condition the voltage applied through the charging port as necessary. For example, if 12 volts is applied to DC charging port 210, the DC-to-DC converter of battery-charging controller 200 may convert the applied 12 volts to about 4.2 volts to about 4.4 volts. Alternatively, DC charging port 210 may bypass battery-charging controller 200 for charging battery 185. DC charging port 210 may also operate as a test port for testing battery 185 for determining whether the battery is diminishing in charging capacity. DC charging port 210 my include test circuitry for testing battery 185 or may be coupled to an external device configured to test the battery.

Charging. As described briefly above, battery 185 may be configured to store 22,000 milliamp-hours of electrical charge and in a fully charged state may fully charge a number of portable electronic devices from a state of complete discharge to a state of full charge. For example, battery 185 may be configured to store sufficient charge for charging three tablet computers, such as iPad® tablet computers of Apple of Cupertino Calif. Any trademarks listed in this patent application are the property of their respective owners.

Via DC-to-DC converter 205 and circuit 180, battery 185 may provide the requisite voltages and currents for a variety of battery types of a variety of types portable electronic devices coupled to charging terminals 165. Specifically, DC-to-DC converter 205 may convert the output voltage of battery 185 (e.g., 3.7 volts for a lithium ion battery) to a voltage level used by a portable electronic device for charging (e.g., about 3.3 volts or 5 volts for a portable phone (e.g., 2G, 3G, 4G, or LTE) or tablet computer).

One or more of charging terminals 165 may be a universal serial bus (USB) terminal (indicated with reference numerals 165a, 165b, and 165c). The USB terminals may be configured as type A, type B, mini-A, mini-B, micro-A, micro-B, or the like, or any combination of the foregoing. Also, other types of connectors such as FireWire (i.e., an IEEE 1394 interface, i.LINK, or Lynx), eSATA, or proprietary connectors (e.g., Apple 30-pin connector, Apple 19-pin connector) may be used instead of, or in addition to, USB terminals. Portable electronic devices may be connected to the charging terminals via cables, such as USB cables where the connectors of the terminals may have the same or different terminal types at opposite ends of the cables.

Charging terminals 165 may be configured to operate according to a variety of USB protocol, such as USB 1.0, 2.0, or 3.0 or the like so that a variety of portable electronic devices 107 may be charged such as the devices listed above as well as MP3 players, handheld GPS devices, portable game consoles, battery rechargers, laptop computers, and the like.

One or more of charging terminals 165 may be DC connectors that provide a relatively low DC output voltage, such as 12 volts. The DC connector may be a coaxial type connector, a cigarette lighter type receptacle, a mini-jack, a micro-jack, or the like. The DC connector may supply DC voltage for powering or charging a variety of devices, such as lights, fans, music players, computers (e.g., laptop computers), beverage heating devices, beverage cooling device, and small motorized tools. The 12-volt outlet may be used in an embodiment of the present invention. The foregoing described embodiments of charging are provided for example and the described embodiments are not exhaustive of the types of charging terminals that that may be included in circuit 180.

Turning now to power inverter 247, the power inverter changes direct current (DC) to alternating current (AC), such as 110 volts AC. Power inverter 247 may be electrically connected to one or more of battery 185 (as shown in FIG. 9), DC-to-DC converter 205, and solar panels 135 and may change the DC voltages supplied by one or more of these elements to AC voltage. An AC voltage put out by power inverter 247 may be used for powering or charging a number of devices, such as electronic devices, tools, and appliances. Many common appliances run on AC power. While FIG. 9 shows that power inverter 247 is located on printed circuit board 170, the power inverter might be configured as a stand alone circuit in housing 145. Further, while FIG. 9 shows that umbrella 100 includes one power inverter, various embodiment of the umbrella may include one or more power inverters. Power inverter 247 may be configured to deliver AC power trough an AC outlet (e.g., NEMA 1-15 or NEMA 5-15 sockets, or other socket types) that may be in housing 145.

Some embodiments of umbrella 100 include a number of solar panels 135 that is sufficient to provide an amount of current that can be used by the umbrella to charge a variety of portable electronic devices without accumulating charge in battery 185. These embodiments might not include a battery and electrical energy generated by the solar panels might be directed to connected portable electronic devices for charging. The electrical energy generated by solar panels 135 might be routed through DC-to-DC converter 205 for conversion to voltages and currents useful for charging the batteries of connected portable electronic devices. It is noted that while umbrella 100 is described herein as being configured to charge the batteries of portable electronic devices, umbrella 100 may be configured to charge a variety of charge store devices includes in portable electronic devices, such as capacitors, super capacitors, or the like.

While various embodiment are described herein the include solar panels for charging battery 185, alternative embodiments of umbrella 100 may include alternative or additional elements for generating electrical energy, such as wind turbines, thermoelectric generators, bioenergy sources, or the like).

Control Circuit. Turning now to control circuit 230 and authentication circuit 235, the control circuit may be a microcontroller, a microprocessor, control logic (e.g., programmable logic or a field programmable gate array), or the like, or any combination of these circuits. In a specific implementation, control circuit 230 is the ATMega32 microcontroller from Atmel Corp. Among other functions, control circuit 230 controls communication with portable electronic devices 107 that are connected to charging terminals 165. Control circuit 230 may operate in conjunction with a discrete USB stack (not shown) or may include a USB stack for facilitating communication with connected portable electronic devices. For example, when a portable electronic device is initially connected to a charging terminal 165, control circuit 230 may operate according to one of the standard USB protocols or other protocols for communicating with the portable electronic device to collect device type information, which specifies the device type of the portable electronic device. The collected device type information may include information that identifies the portable electronic device, for example, as a phone, a tablet computer, a PDA, or the like.

Control circuit 230 may transfer the collected device type information to authentication circuit 235, which may use the collected device type information to authenticate the device type and to determine the charging parameters (e.g., a charging voltage and a charging current) for the device type. If the authentication circuit cannot verify the device type for the connected portable electronic device, the portable electronic device may display a message (sometimes referred to as a "nag" message) that indicates that the portable electronic device is not compatible for charging with umbrella 100.

Thereafter, control circuit 230, authentication circuit 235, or both may use the charging parameters for configuring battery control circuit 200, DC-to-DC converter 205, or other circuits, or any combinations of these circuits for providing an appropriate charging voltage and charging current to the portable electronic device for charging where the appropriate charging voltage and charging current are known from the charging parameters determined by the authentication circuit. For example, if battery 185 is a lithium ion battery that supplies 3.7 volts, DC-to-DC converter 205 can raise the voltage supplied through the charging terminal to about 4.2 volts to about 4.4 volts for charging a lithium ion battery in the connected portable electronic device.

Battery Gauge. Turning now to battery gauge 220 and A-to-D converter 215, the battery gauge in conjunction with the A-to-D converter is configured to determine a charge level of battery 185. More specifically, A-to-D converter 215 may be electrically connected to battery 185 and sense the voltage across the battery's terminals. Thereafter, the A-to-D converter may convert the sensed analog voltage to a digital value of the voltage and supply the digital value to battery gauge 220, which may determine a charge level for the battery from the sensed voltage. Battery gauge 220 may then transfer charge level information for the charge level to control circuit 230. Control circuit 230 may then appropriately enable battery level indicator 240 to indicate to a user the battery's charge level.

Battery level indicator 240 may include a number of lights 250 (e.g., four or more LEDs, see FIG. 6) for indicating the charge status of battery 185. A larger number of lighted LEDs may indicate a high level of charge and a low number of lighted LEDs may indicate a low level of charge. If battery level indicator 240 indicates that battery 185 has a low level of charge, a user might turn the top of the umbrella to face the sun to increase the electrical energy generated by solar panels 135. For example, there can be 1, 2, 3, 4, 5, 6, or other number of LEDs or other indicators to represent a stored charge level of the battery. Typically, the more indicators that are turned on will indicate a greater amount of stored charge in the battery. When no indicators turn on, the battery will be discharged. The battery can be charged, and when fully charged, all indicators should be turned on. In other implementations, in a reverse indicator scheme, the indicators can be turned off to indicate a charged battery and turned on to indicate a discharged battery. The battery indicator can be oriented in a vertical direction (as shown in the specific implementation) or other orientation, such a horizontal direction, or circular or other curved arrangement.

As shown in FIG. 4, battery housing 147 may have an opening formed therein that exposes lights 250 of battery level indicator 240. According to one implementation, battery level indicator 240 may include the indicator controller 245, which is configured to be activated by a user for turning on lights 250. According to another embodiment, indicator controller 245 may be configured to initiate battery gauge 200 and analog-to-digital (A-D) converter 215 determining the charge level of battery 185.

Various components of circuit 180 may be in sleep modes when not in use to preserve the charge of battery 185. For example, A-to-D converter 215, battery gauge 200, control circuit 230, and authentication circuit 235 may each have sleep modes that are used by these circuits when the circuits are not in use. User activation of indicator controller 245, detection of a recently connected portable electronic device, or the like may wake (e.g., enter a full power mode) the sleeping circuits.

Battery gauge 220 may also be configured to provide information for the operating hours of battery 185, that maintenance status of the battery, or any combination of these and other parameters. These parameters may be indicated to a user via battery level indicator 240 on light 250 or other display types, such as a display (e.g., a liquid crystal display, which may display text and numbers). This information may be important to a user of the present invention in order to gauge the types and quantity of devices to charge at a given time. In other implementations, more than one gauge may be used with umbrella 100.

In one embodiment, circuit 180 may include a voltage conversion circuit 255 to step down the generated voltage of the solar panels 135, the output voltage of battery 185, or both for powering the various circuits on PCB 170. For example, voltage conversion circuit 255 may step down the 12 volts generated by solar panels 135 to 3.3 volts, 5.0 volts, or the other voltage used by the circuits on the PCB.

Figure 10A:
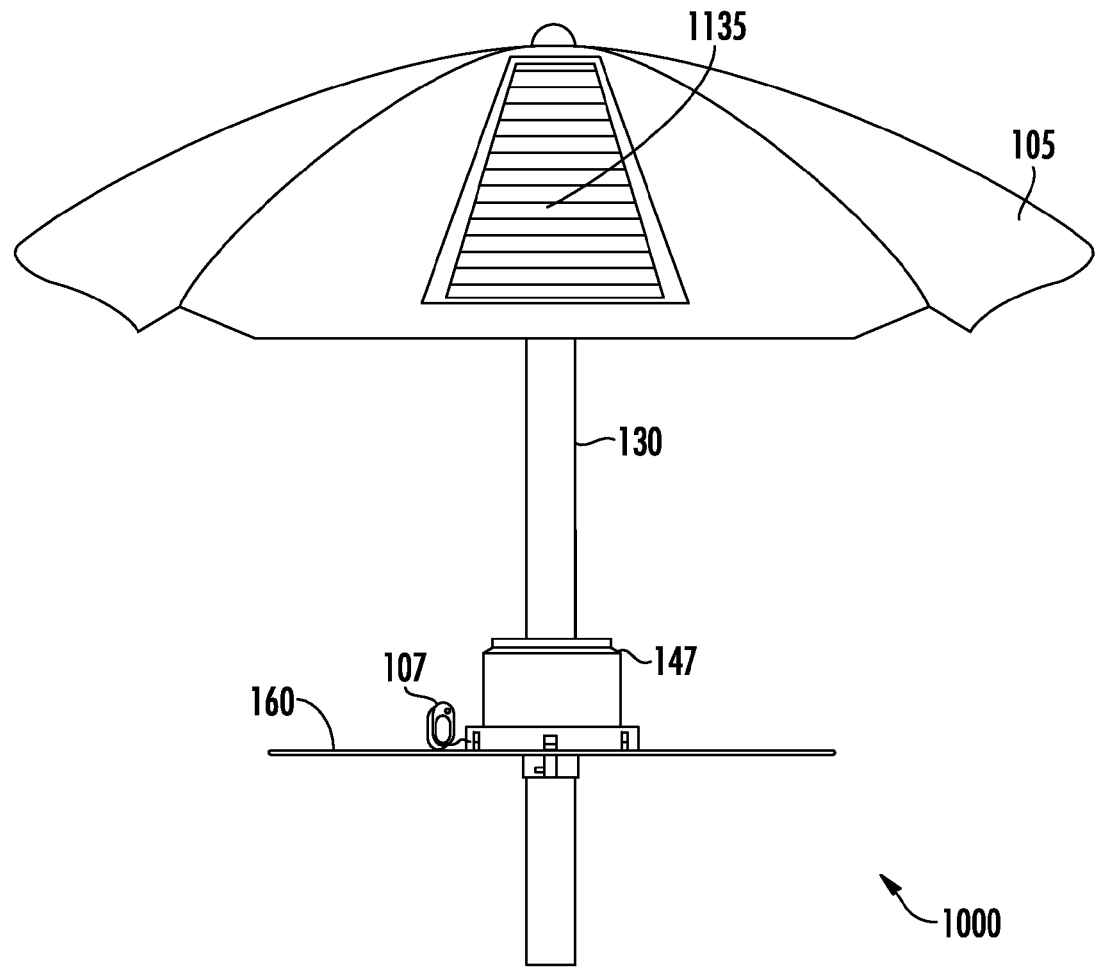
FIGS. 10A and 10B show simplified side and top views, respectively, of an umbrella according to an alternative embodiment.
Figure 10B:
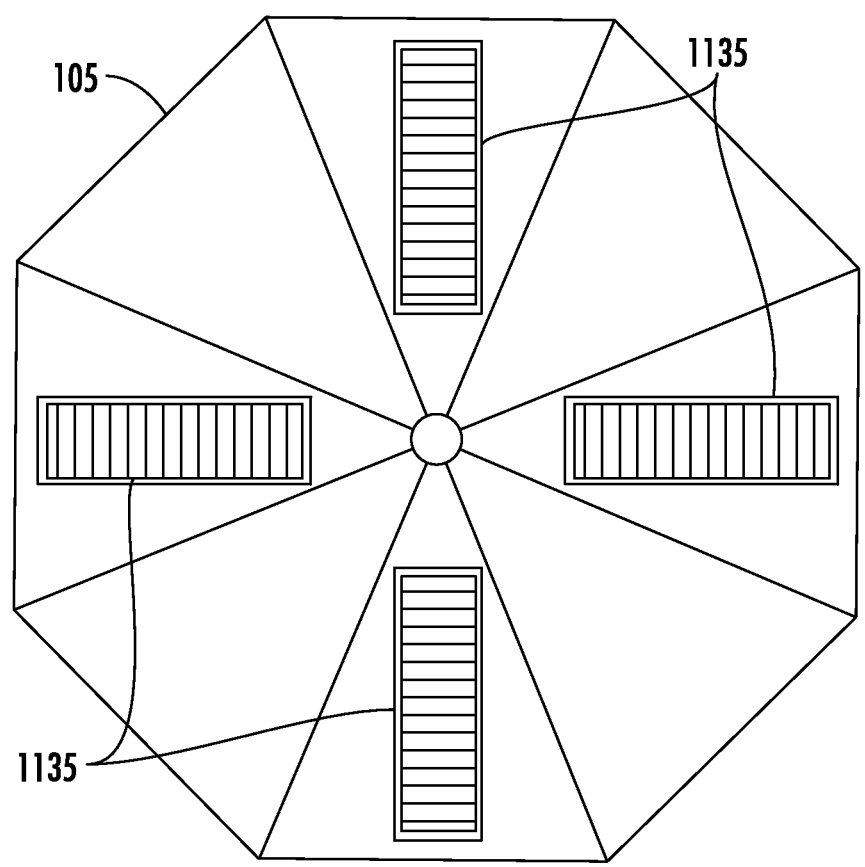

FIGS. 10A and 10B are a simplified side view and a top view of an umbrella 1000 according to one alternative embodiment of the present invention. Umbrella 1000 is substantially similar to umbrella 100 described above, but differs from umbrella 100 in that solar panels 1135 are foldable and may be attached to shade 105, struts 110, or both. Solar panels 1135 may be foldable solar panels and may be folded with shade 105 as the shade is closed, and may be unfolded with the shade as the shade is opened. In one embodiment solar panels, 1135 are positioned on shade 105 and between struts 105 where sides of the solar panels may or may not be attached to the struts. In an alternative embodiment, solar panels 1135 are positioned on shade 105 and straddle struts 105. For example, solar panels 1135 may be on shade 105 and may be laterally centered on struts 105.

Umbrella 1000 may include one or more solar panels 1135, which may be positioned on each panel (i.e., each section of the shade between a pair of struts 110) of shade, on every other panel, or the like. In other implementations, the quantity and arrangement of the solar panels may be varied in accordance for various other types of outdoor umbrellas or other types of sunshades and furniture having sunshades.

Solar panels 1135 may include an electronic integrated photovoltaic system (EIPV) which may be made from copper-indium-gallium-diselenide (CIGS) thin-film semiconductors. The EIPV may be manufactured on relatively thin plastic substrates which provide the flexibility for integrating solar panel 1135 onto the material forming shade 105 and for folding with the shade as the shade is opened and closed. In one specific embodiment, each of the soar panels 1135 has a width of about 9.38 inches, and a length of about 27 inches. In a folded arrangement, a width of each of the folded solar panels 135 is about 5 inches or less, and may have a length of about 9.5 inches, and a height is about 1.25 inches. A weight of each of solar panels 1135 may be about 12 ounces to about 16 ounces (e.g., about 14.8 ounces). The dimensions of the solar panel can vary, however, according to the type and size of the shade of the umbrella. Furthermore, the shape (e.g., rectangular, square, circular, triangular, or trapezoidal) of solar panels 1125 may vary according to the size of umbrella. Solar panels 1135 may be custom made to fit various shapes and sizes of shades 105. Specific implementations of solar panels 135 and 1135 may be manufactured by Ascent Solar Technologies, Inc. and known as the WaveSol Mobile, WaveSol Mobile Fringe, and WaveSol Light, all of which are trademarks of Ascent Solar Technologies, Inc.

Solar panels 1135 may be attached to shade 105 by a variety of devices and techniques, such as fasteners, eyelets and hooks, buttons and button holes, grommets, zip ties (also known as cable ties and tie wraps), Velcro® of Velcro Industries B.V., sewing, adhesives, material infusion (application of heat to bond the raw materials), or the like. These attachment devices allow for the removal and replacement of solar panel 1135 if a solar panel needs to be replaced. While both solar panels 135 and 1135 are shown in the various figures as being arranged from a top of shade 105 and extending outward along the shade, the solar panels can be arranged in a variety of configurations, such as side-by-side, in rings or arcs about circumferences of the shade, or a variety of other configurations.

Figure 10C:
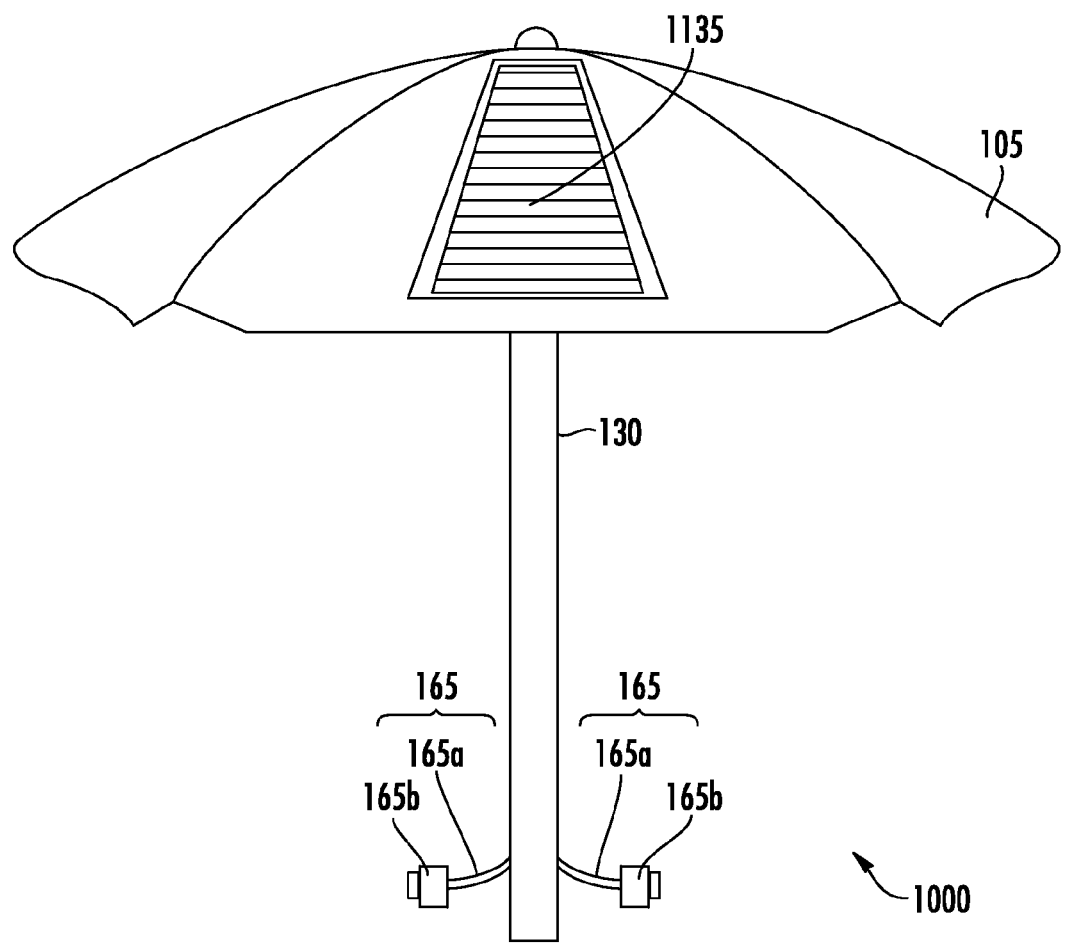
FIG. 10C shows a simplified image of the umbrella shown in FIGS. 10A and 10B where the charging terminals includes wires that extend the charging terminals from the umbrella pole or the battery housing.

FIG. 10C is a simplified image of umbrella 1000 according to one alternative embodiment where charging terminals 165 includes wires 165a that extend the charging terminals (e.g., an end terminal 165b) from umbrella pole 130 or battery housing 147 (not shown in FIG. 10c). Wires 165a may be retractable into battery pole or battery housing 147. Alternative embodiments of umbrella 100 may similarly include charging terminals 165 with wires 165a that extend the charging terminals from umbrella pole 130 or battery housing 147.

Figure 11A:
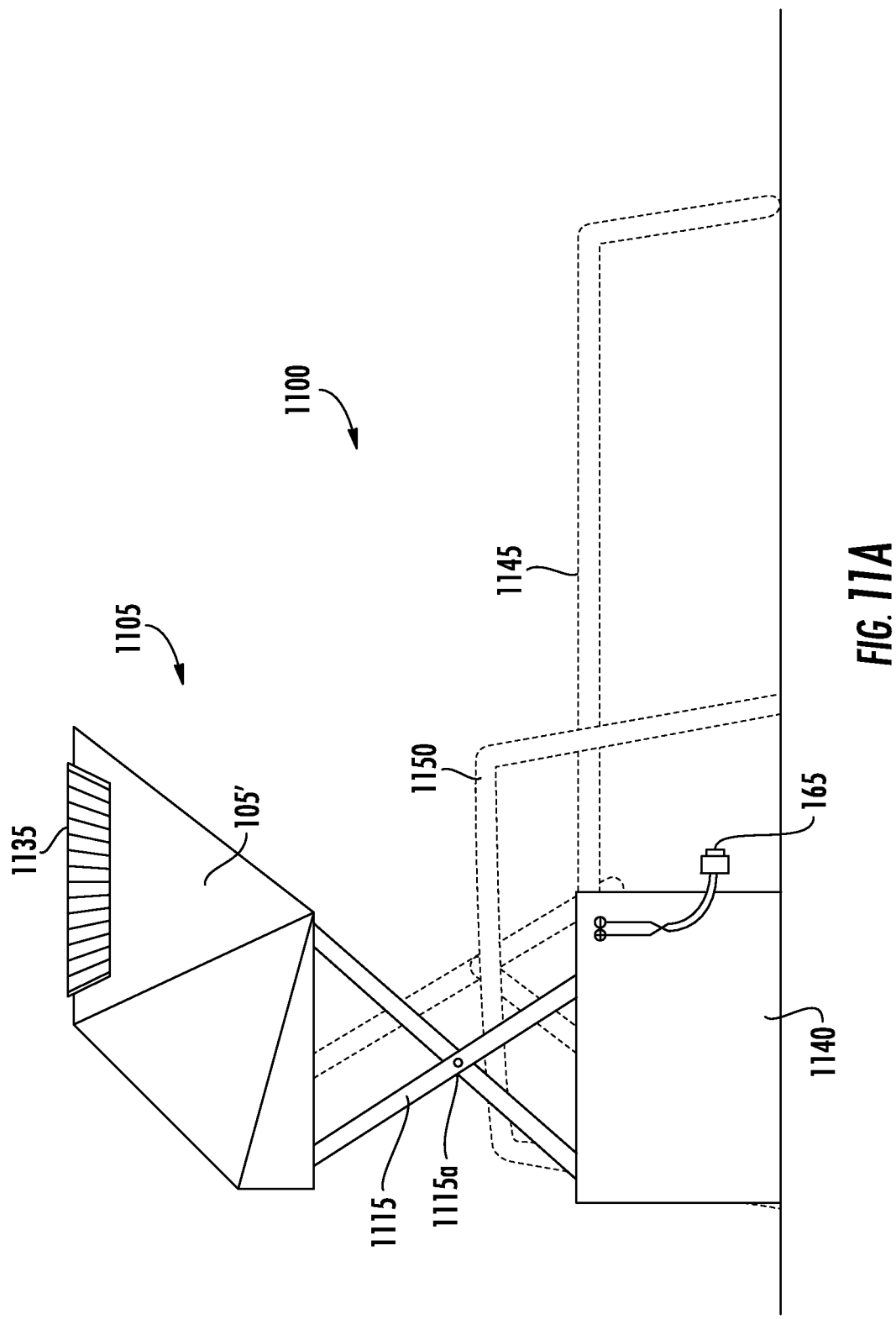
Figure 11B:
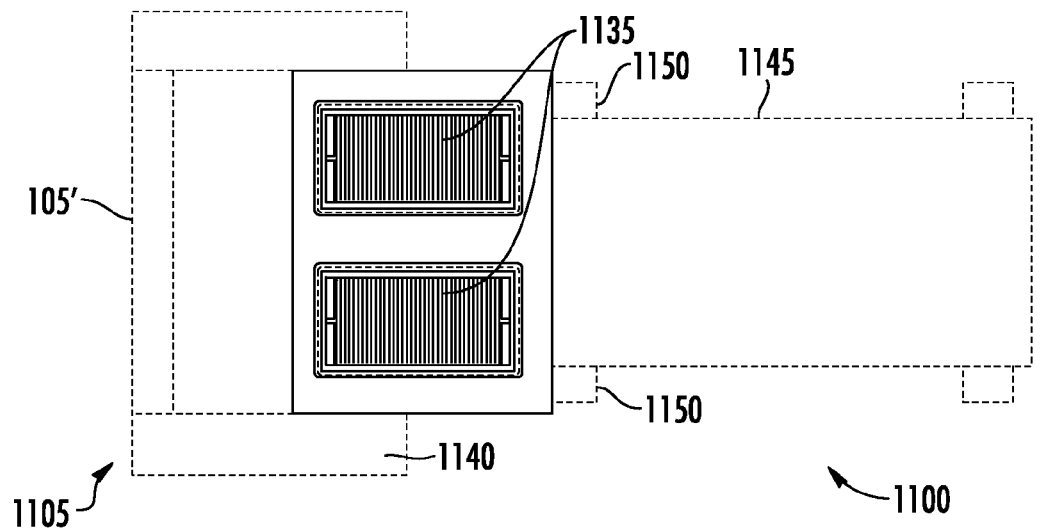
Figure 11C:
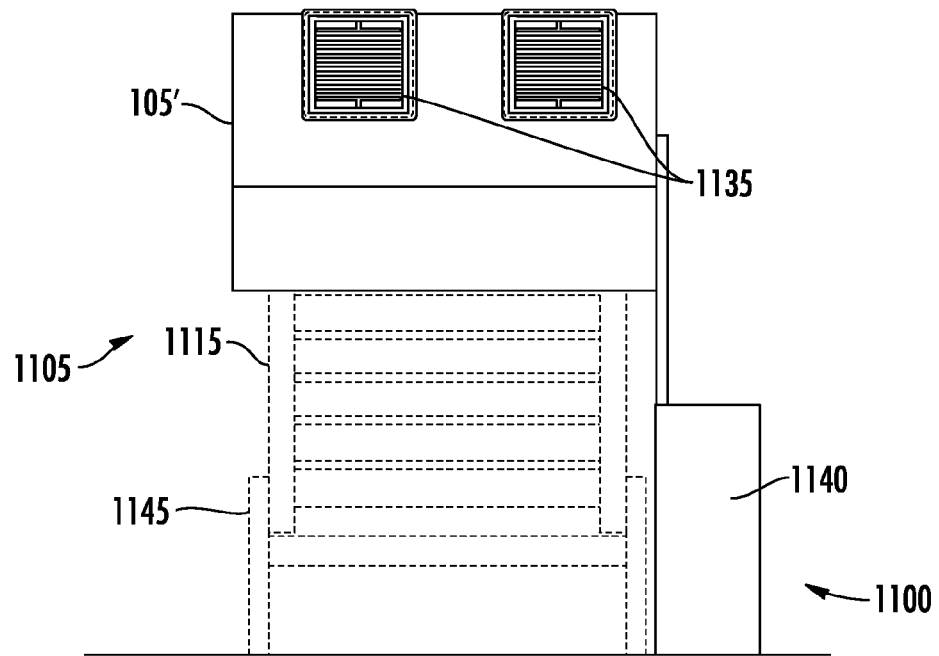

FIGS. 11A, 11B, and 11C are simplified side views, top view, and back views, respectively of specific embodiment of the invention incorporated in a chaise lounge 1100. Chase lounge 1100 includes an umbrella 1105 that includes one or more solar panels 135 or 1135 attached to a panel 1110 of a foldable shade 105'. Foldable shade 105' may be coupled to a frame structure 1115 that couples to a seating portion of chase lounge 1100. Foldable shade 105' and frame structure 1115 may be adjustable by folding the foldable shade and the frame structure backward or forward with respect to the length of the chase lounge by a user to protect against direct sunlight. Frame structure 1115 may include a hinge 1115a that allows the frame structure to fold including being foldable for storage.

In the specific embodiment shown in FIGS. 11B and 11C, two solar panels are attached to an upper panel of foldable shade 105'. In other implementations, fewer or more solar panels may be integrated into foldable shade 105'. Chase lounge 1100 may include a storage unit 1140 configured to house battery 185, PCB 170, circuit 180, charging terminals 165, and the like described above. Storage unit 1140 may be box shaped and be incorporated with chase lounge 1100 along a side of the chase lounge as shown in FIGS. 11A-11C or may be incorporated into other elements of the chase lounge such as the frame 1145 and the arm rests 1150 of the chase lounge to provide an esthetic and functional design. In other embodiments, storage unit 1140 may be incorporated into the frame structure 1115, or a combination of the elements of the chase lounge. For example, the storage unit 1140 may be located on a back side of foldable shade 105'. Charging terminals 165 and charge indicator 167 may be located on a variety of locations on chase lounge 1100. For example, one or more charging terminal 165 and charging terminal 167 may be located on frame structure 1115, storage 1140, frame 1145, arm rest 1150, or the like. In some implementation, the umbrella 1105 and from structure 1115 are separable from the sitting portion of chase lounge 1100 and are moveable from one location to another. For example, umbrella 105' and foldable structure 1115 may be configured for free standing use and might includes at least one wheel allowing for relatively easy moving.

Figure 12B:
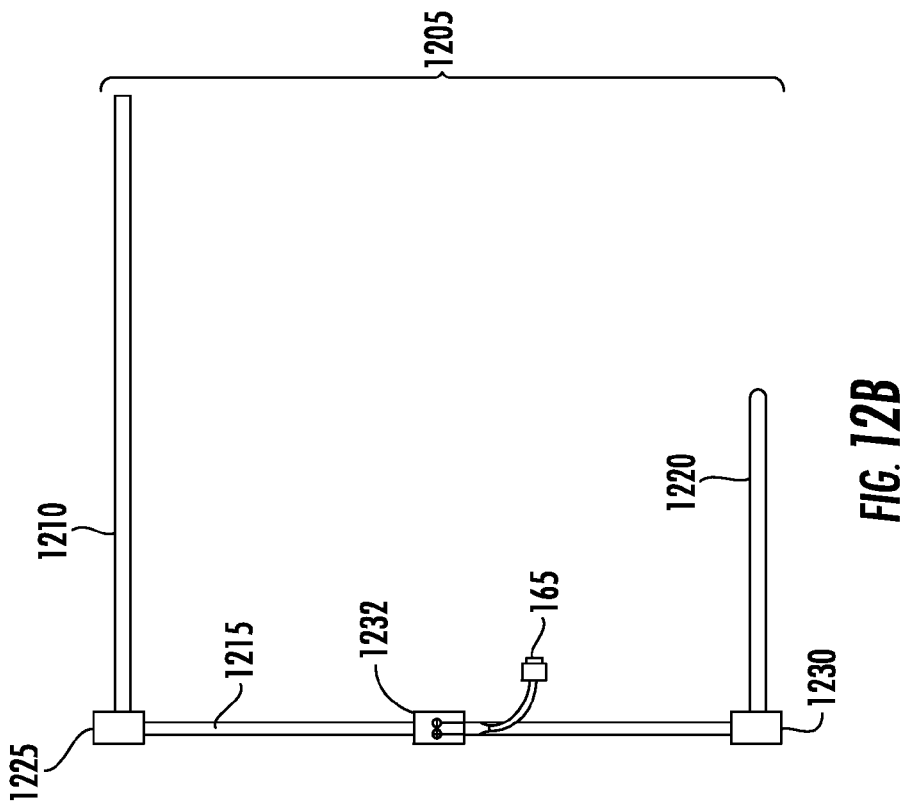
FIGS. 12A and 12B show side views of a detachable sunshade according to one embodiment.
Figure 12A:
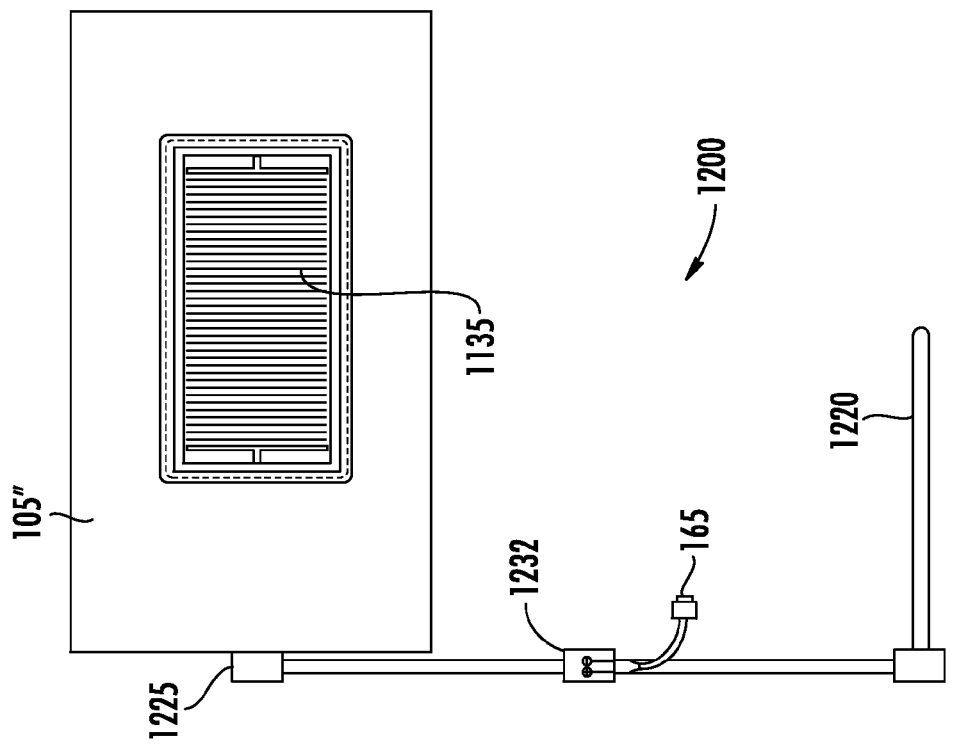
Figure 12C:
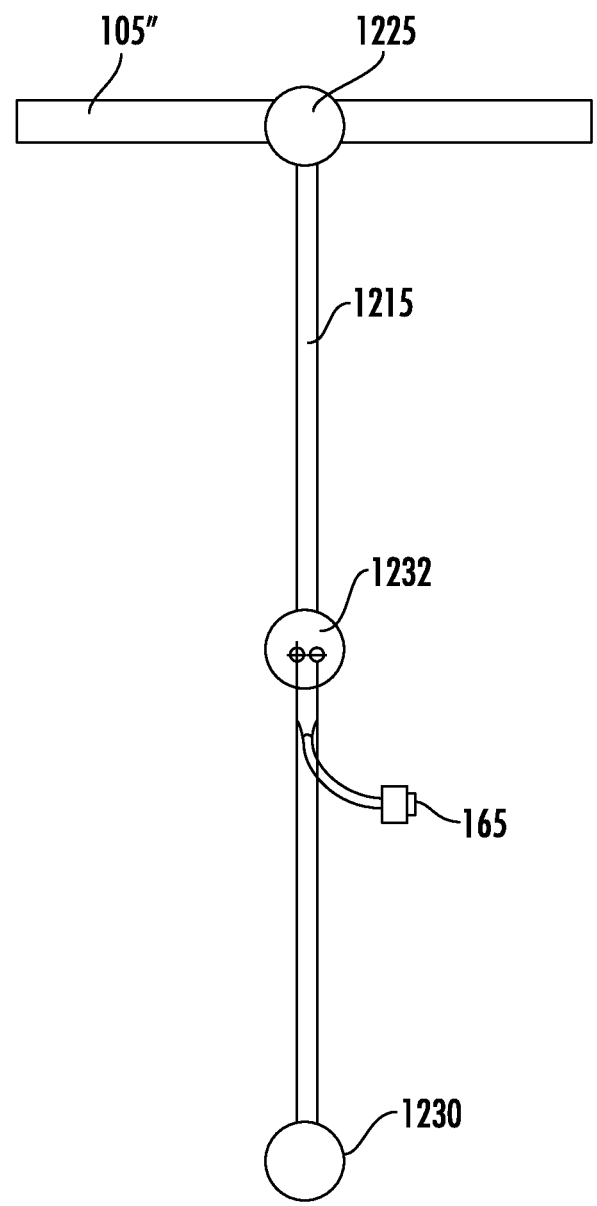
FIG. 12C shows a back view of the detachable sunshade, which is shown in FIGS. 12A and 12B.

FIGS. 12A and 12B are side views of a detachable sunshade 1200, and FIG. 12C is a back view of the detachable sunshade according to another embodiment. Sunshade 1200 may be include a frame structure 1205 that includes a sunshade support 1210, a spine 1215, and a connector 1220. Sunshade support 1210 and spine 1215 may be coupled by a first hinge section 1225, and spine 1215 and connector 1220 may be coupled be a second hinge section 1230. Detachable sunshade 1200 may further include a shade 105" that is coupled sunshade support 1210 and is adjustable by rotating sunshade support 1210 with respect to spine 1215 via the first hinge section 1225. Shade 105" may be further adjustable by rotating spine 1215 with respect to connector 1220. Accordingly, first hinge section 1225 may provide for relatively fine rotational adjustments of detachable sunshade 1210, and second hinge second 1225 may provide for relatively coarse rotational adjustments of detachable sunshade 1210. In alternative embodiments, one or both of the first and the second hinge sections 1225 and 1230 may be fixed joints that do not allow for rotation of sunshade support 1210. FIG. 12A shows shade 105″ rotated into a planar view and FIG. 12B shows the shade rotate about ninety degrees from the planar view of FIG. 12A. According to an additional embodiment, frame structure 1205 may include a rotational joint 1232 that is positioned at a central location on spine 1215 (see FIG. 12C) where the rotational joint provides for the detachable sunshade to be folded substantially in half for storage or the like.

Connector 1220 may be configured to be removably attached to an outdoor table, a bar, chair, or the like. Accordingly, connector 1220 provides for relatively easy movement of detachable sunshade 1200 from one location to anther location.

According to one embodiment, a length of the shade 105″ is about 20 inches to about 30 includes long and is about 10 inches to about 20 includes wide. Shade 105″ includes a solar panel 135 or 1135 that may be integrated onto the shade. Frame structure may include the various electronic elements describe above, such as battery 185, PCB 170, circuit 180, charging terminals 165, and the like described above. One or more charging terminals 165 and charge indicator 167 may be located on a variety of locations on detachable sunshade 1200, such as on shade 105″, sunshade support 1210, spine 1215, and connector 1220, or any combination of these. Further, while shade 105' is shown in FIG. 10A as including one solar panel, shade 105″ may include more solar panels, such as are needed for various current demands for charging battery 185 or for substantially direct connection to charging terminals 165.

In a specific implementation, one or more self adjusting solar panels may be attached to outdoor furniture described herein. The solar panels may be configured to self adjust to changing sunlight conditions by using various mechanisms to face the solar panels more favorably towards a light source (e.g., to track the moving sun). For example, some solar panels 135 contain converters that allow the solar panels to turn automatically to collect a substantially optimum amount of sunlight for generating a substantially optimum amount of electrical energy. Other solar panels may includes servo motors or the like to adjust the angle of the solar panels toward a light source to substantially optimize light exposure.

In another specific implementation, the present invention includes a reset feature which allows the user to reset the charging function of the solar panels. Portable solar panels, such as solar panels 135 and 1135 may need to be unplugged and replugged from time to time in order to reset charging. This can be cumbersome and dangerous to the user. The improved reset feature may be incorporated into the present invention in the form of a reset switch, button, or other type of user control. The reset option would disengage the electrical current and then re-engage it to reset the charging.

In further implementations, the solar panels or solar cells are integrated into the shades and are not necessarily separate panels incorporated onto the outdoor furniture. In an implementation, solar cells are printed onto a surface of the shade material (e.g., printed on textile, material, fabric, cloth, or similar materials). Printing solar panels can be on materials made by weaving, knitting, crocheting, knotting, or pressing fibers together.

For example, the solar panels are printed on materials that are used for shades 105, 105', 105″, or the like. Using printed solar panels, the fabrics of the shades can continue to bend, fold, crease, stretch, or otherwise used as they normally would.

In an implementation, the fabric portion of the shades is constructed, in part or in whole, from solar thread. This solar thread incorporates photovoltaic material (e.g., a coating) to generate solar energy. For example, the threads may include a core that is surrounded by one or more layers (e.g., electrode layer, power generating layer, conductive layer, and layers for hole transport). Light shines on the photovoltaic material of the thread, which generates electricity, and the thread carries this electrically energy to an electrode (e.g., for charging batteries or an electronic device).

Using solar thread, solar panels can be woven into a variety of materials used in the shades described herein, or shades can be made entirely from solar thread. The material incorporating the solar thread can be used to generate solar energy. The solar cells need not be limited to specific arrangements on the fabric (e.g., between adjacent ribs of an umbrella). They may be incorporated into the fabric as desired.

In another implementation, photovoltaic material is infused into the fabric material of the shades. For example, individual fibers are coated with photovoltaic material (i.e., semi-conducting material) to convert collected sunlight into electrical energy. In another implementation, the photovoltaic material is infused into a distinct fibrous layer of the fabric of the shades. Further, in other implementations, a system of building integrated photovoltaics is used, in which solar cells are embedded, infused, or otherwise incorporated into building materials. For example, plastic-based solar panels can be used to construct a plastic awning for a building.

In other implementations, solar panels are incorporated shades using various other techniques. For example, solar panels may be deposited on surfaces of materials using a spray-on technique or other application techniques. Furthermore, solar-powered textiles can be created using processes such as weaving, knitting, braiding, and felting.

In other implementations, outdoor furniture collect ambient thermal energy or generate thermal energy from collected light, such as sunlight. Heat from solar energy can be used to generate thermal energy that is used to produce various types of power including electrical, mechanical, and chemical power. Sunlight from solar radiation may be collected, concentrated, and converted into heat energy. This heat energy may be used to generate alternative forms of energy. For example, heat may be collected in solar concentrators (e.g., parabolic mirrors, lenses, and reflectors, flat mirrors and receivers, or dish systems), and used to drive a generator to produce electrical energy.

In another implementation, a combination of thermal conversion systems and photovoltaic systems is used to collect both light and heat from solar radiation that is used to generate electrical energy, mechanical energy, and chemical energy.

FIG. 13 is an image of an environment where embodiments of the present invention, such as umbrellas 100, lounge chairs 1100, detachable sunshades, beach cabanas 1300, or the like, may be used by a user for charging a portable electronic device. For example, in a beach environment as shown in FIG. 10, a main power source 1100 or an electrical outlet 1105 on a hotel building 1110 may not be relatively close to where umbrellas 100 or lounge chars 1100 may be used on a beach or other recreation location, and therefore, running power lines to such areas may not be convenient or safe. Even if power lines could be run to such areas, the power lines may not have the movable convenience of the embodiments of the present invention when uses might move and move their umbrellas 100 or lounge chairs 1100 to follow the sun, follow the shade, move to a different section of beach, or the like.

As users often enjoy such outdoor locations for several hours, and as user use their portable electronic device for several hours, the batteries of these devices need to be recharged for continued use and enjoyment. Outdoor furniture and sunshades, such as umbrella 100, of the present invention provide users with a convenient, portable, and local source for charging their portable electronic devices throughout the daytime hours and into the evening and night where charge stored in batteries 185 may be used for such charging.

Other benefits of the embodiments of the present invention include simple storage in a storage area 1320 or the like. The embodiments can be stored without the need to unplug and wind up any power cords. Each embodiment can be folded, disassembled, moved, or the like, as it normally would, and moved to storage area 1320 while the parts of the power supply systems (i.e., solar panel, battery, and circuits, and charging connectors for devices) stay incorporated with the embodiments since they are physically integrated.

As discussed previously, umbrella 100, chair 1100, detachable sunshades 1200, cabana 102 with solar panels 135 or 1135 are movable and can be collapsed into a compact form (e.g., folded umbrella, folded lounge chair, or the like) or otherwise folded into a housing (e.g., shade rolled up into a box). In one business application for umbrella 100, chair 1100, detachable sunshade 1200, cabana 102, or the like, guests of a hotel, cruise ship, or the like can rent out these devices and can move them (e.g., wheeled from location to another location) where the guests would like to be. Further, a number of umbrella, lounge chairs, cabanas, or the like with integrated solar panels can be rented by a rental company (e.g., which can deliver via a truck or van) to various locations. Ordering or reservations may be via the Internet (e.g., Web browser) or a smartphone application. Then during winter, a hotel (and other rental customers) can stop renting and let the rental company pick up and store the sunshades with integrated solar panels in a warehouse.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. An umbrella comprising:
   a shaft;
   an umbrella shade, coupled between a cap retainer and the shaft;
   a frame structure comprising:
   a cap, coupled between the cap retainer and the umbrella shade, comprising a cap opening and at least a first hinge portion and a second hinge portion, wherein the cap retainer couples to a bolt of the shaft that passes through the cap opening;
   a first strut, comprising first and second ends, a third hinge portion at the first end, and between the first and second ends is a first sleeve that houses at least a first solar panel, wherein the first sleeve comprises a first clear surface that is above the first solar panel such that light can pass through the first clear surface to be collected by the first solar panel for conversion into electrical energy, and the third hinge portion is adapted to mate with the first hinge portion of the cap to form a first strut hinge; and
   a second strut, comprising third and fourth ends, a fourth hinge portion at third end, and between the third and fourth ends is a second sleeve that holds at least a second solar panel, wherein the second sleeve comprises a second clear surface that is above the second solar panel such that light can pass through the second clear surface to be collected by the second solar panel for conversion into electrical energy, and the fourth hinge portion is adapted to mate with the second hinge portion of the cap to form a second strut hinge,
   the umbrella comprises an open position during which the umbrella shade is extended into a position away from the shaft and a closed position during which the umbrella shade is folded into a position closer to the shaft, and
   when changing the umbrella from the closed to the open position, the umbrella shade pushes against a bottom of the struts while the umbrella shade is extended, causing the struts to rotate via the first and second strut hinges so that an angle between a top of the first strut and a top of the cap increases from a first angle in the closed position to a second angle in the open position, and the second angle is greater than the first angle; and
   a rechargeable battery configured to be recharged by the first and second solar panels; and
   a first USB charging terminal, coupled to the rechargeable battery, configured to connect via a first cable to a first electronic device and supply charge from the rechargeable battery to the first electronic device.

2. The umbrella of claim 1 wherein when changing the umbrella from the open to the closed position, the bottom of the struts rest against the umbrella shade while the umbrella is folded, causing the struts to rotate via the first and second strut hinges so that the angle between the top of the first strut and the top of the cap decreases from the second angle to the first angle.

3. The umbrella of claim 1 wherein a shape of the umbrella shade is square.

4. The umbrella of claim 1 wherein a shape of the umbrella shade is hexagonal.

5. The umbrella of claim 1 wherein a shape of the umbrella shade is octagonal.

6. The umbrella of claim 1 wherein the umbrella shade has a diameter from about 6 feet to about 9 feet when the umbrella is in the open position.

7. The umbrella of claim 1 wherein the umbrella shade has a diameter of about 9 feet when the umbrella is in the open position.

8. The umbrella of claim 1 wherein the umbrella shade has a diameter from 7 feet to about 11 feet when the umbrella is in the open position.

9. The umbrella of claim 1 wherein the rechargeable battery comprises a 22,000 milliamp-hour capacity.

10. The umbrella of claim 1 comprising:
a battery level indicator, coupled to the rechargeable battery, wherein the battery level indicator comprises a plurality of light emitting diodes (LEDs) where one or more of the LEDs are illuminated to indicate an amount of charge remaining in the rechargeable battery, and a greater number of LEDs that are illuminated indicates a greater amount of charge remaining in the rechargeable battery.

11. The umbrella of claim 1 comprising:
a second USB charging terminal, coupled to the rechargeable battery, configured to connect via a second cable to a second electronic device and supply charge from the rechargeable battery to the second electronic device, simultaneously while charge is being supplied from the first USB charging terminal.

12. The umbrella of claim 11 comprising:
a third USB charging terminal, coupled to the rechargeable battery, configured to connect via a third cable to a third electronic device and supply charge from the rechargeable battery to the third electronic device, simultaneously while charge is being supplied from the first and second USB charging terminals.

13. An umbrella comprising:
an umbrella shaft;
an umbrella shade, coupled between a cap retainer and the shaft;
a frame structure comprising:
a cap, coupled between the cap retainer and the umbrella shade, comprising a cap opening and at least a first hinge portion and a second hinge portion, wherein the cap retainer couples to a bolt of the shaft that passes through the cap opening;
a first strut, comprising first and second ends, a third hinge portion at the first end, and between the first and second ends is a first sleeve that houses at least a first and a second solar panel, wherein the first sleeve comprises a first clear surface that is above the first and second solar panels such that light can pass through the first clear surface to be collected by the solar panels for conversion into electrical energy, and the third hinge portion is adapted to mate with the first hinge portion of the cap to form a first strut hinge; and
a second strut, comprising third and fourth ends, a fourth hinge portion at third end, and between the third and fourth ends is a second sleeve that holds at least a third and a fourth solar panel, wherein the second sleeve comprises a second clear surface that is above the third and fourth solar panels such that light can pass through the second clear surface to be collected by the solar panels for conversion into electrical energy, and the fourth hinge portion is adapted to mate with the second hinge portion of the cap to form a second strut hinge,
the umbrella comprises an open position during which the umbrella shade is extended into a position away from the shaft and a closed position during which the umbrella shade is folded into a position closer to the shaft,
when changing the umbrella from the closed to the open position, the umbrella shade pushes against a bottom of the struts while the umbrella shade is extended, causing the struts to rotate via the first and second strut hinges so that an angle between a top of the first strut and a top of the cap increases from a first angle in the closed position to a second angle in the open position, and the second angle is greater than the first angle, and
a rechargeable battery, configured to be recharged by the solar panels;
a first USB charging terminal, coupled to the rechargeable battery, configured to connect to a first portable electronic device and supply charge from the rechargeable battery to the first portable electronic device;
a second USB charging terminal, coupled to the rechargeable battery, configured to connect to a second portable electronic device and supply charge from the rechargeable battery to the second portable electronic device;
a third USB charging terminal, coupled to the rechargeable battery, configured to connect to a third portable electronic device and supply charge from the rechargeable battery to the third portable electronic device; and
a printed circuit board, coupled to the rechargeable battery and the charging terminal, wherein the printed circuit board comprises an aperture through which the shaft passes through, thus securing the printed circuit board to the umbrella, and the printed circuit board comprises:
a first DC-to-DC converter circuit, coupled between the rechargeable battery and the charging terminals, wherein the first DC-to-DC converter circuit comprises an input to receive a first voltage level from the rechargeable battery and an output to provide a second voltage level to the charging terminals, and the second voltage level is different from the first voltage level;
an analog-to-digital converter circuit, coupled to the rechargeable battery; and
a battery gauge circuit, coupled to the analog-to-digital converter circuit, wherein the battery gauge circuit comprises a plurality of light emitting diodes (LEDs), and the battery gauge circuit causes one or more of the LEDs to illuminate to indicate an amount of charge remaining in the rechargeable battery, and a greater number of LEDs that are illuminated indicates a greater amount of charge remaining in the rechargeable battery.

14. The umbrella of claim 13 wherein when changing the umbrella from the open to the closed position, the bottom of the struts rest against the umbrella shade while the umbrella is folded, causing the struts to rotate via the first and second strut hinges so that the angle between the top of the first strut and the top of the cap decreases from the second angle to the first angle.

15. The umbrella of claim 13 comprising:
a solar cell battery charging block comprising a second DC-to-DC converter circuit, coupled between the solar panels and the rechargeable battery, wherein the first, second, and third USB charging terminals are not directly coupled to the solar panels.

16. The umbrella of claim 13 wherein the second voltage level is above the first voltage level.

17. An umbrella comprising:
an umbrella shaft;
an umbrella shade, coupled between a cap retainer and the shaft;
a frame structure comprising:
a cap, coupled between the cap retainer and the umbrella shade, comprising a cap opening and at least a first hinge portion, a second hinge portion a third hinge portion, and a fourth hinge portion, wherein the cap retainer couples to a bolt of the shaft that passes through the cap opening;
a first strut, comprising first and second ends, a fifth hinge portion at the first end, and between the first and second ends is a first sleeve that houses at least one solar panel, wherein the first sleeve comprises a first clear surface that is above the solar panel such that light can pass through the first clear surface to be collected by the solar panel for conversion into electrical energy, and the fifth hinge portion is adapted to mate with the first hinge portion of the cap to form a first strut hinge;

a second strut, comprising third and fourth ends, a sixth hinge portion at the third end, and between the third and fourth ends is a second sleeve that holds at least one solar panel, wherein the second sleeve comprises a second clear surface that is above the solar panel such that light can pass through the second clear surface to be collected by the solar panel for conversion into electrical energy, and the sixth hinge portion is adapted to mate with the second hinge portion of the cap to form a second strut hinge;

a third strut, comprising fifth and sixth ends, a seventh hinge portion at the fifth end, and between the fifth and sixth ends is a third sleeve that holds at least one solar panel, wherein the third sleeve comprises a third clear surface that is above the solar panel such that light can pass through the third clear surface to be collected by the solar panel for conversion into electrical energy, and the seventh hinge portion is adapted to mate with the third hinge portion of the cap to form a third strut hinge; and a fourth strut, comprising seventh and eighth ends, an eighth hinge portion at the seventh end, and between the seventh and eighth ends is a fourth sleeve that holds at least one solar panel, wherein the fourth sleeve comprises a fourth clear surface that is above the solar panel such that light can pass through the fourth clear surface to be collected by the solar panel for conversion into electrical energy, and the eighth hinge portion is adapted to mate with the fourth hinge portion of the cap to form a fourth strut hinge, the umbrella comprises an open position during which the umbrella shade is extended into a position away from the shaft and a closed position during which the umbrella shade is folded into a position closer to the shaft, when changing the umbrella from the closed to the open position, the umbrella shade pushes against a bottom of the struts while the umbrella shade is extended, causing the struts to rotate via the first, second, third, and fourth strut hinges so that an angle between a top of the first strut and a top of the cap increases from a first angle in the closed position to a second angle in the open position, and the second angle is greater than the first angle, and a rechargeable battery, configured to be recharged by the solar panels;

a first USB charging terminal, coupled to the rechargeable battery, configured to connect to a first portable electronic device and supply charge from the rechargeable battery to the first portable electronic device;

a second USB charging terminal, coupled to the rechargeable battery, configured to connect to a second portable electronic device and supply charge from the rechargeable battery to the second portable electronic device;

a third USB charging terminal, coupled to the rechargeable battery, configured to connect to a third portable electronic device and supply charge from the rechargeable battery to the third portable electronic device; and a printed circuit board, coupled to the rechargeable battery and the charging terminal, wherein the printed circuit board comprises an aperture through which the shaft passes through, thus securing the printed circuit board to the umbrella, and the printed circuit board comprises:

a first DC-to-DC converter circuit, coupled between the rechargeable battery and the charging terminals, wherein the first DC-to-DC converter circuit comprises an input to receive a first voltage level from the rechargeable battery and an output to provide a second voltage level to the charging terminals, and the second voltage level is different from the first voltage level.

18. The umbrella of claim 17 wherein when changing the umbrella from the open to the closed position, the bottom of the struts rest against the umbrella shade while the umbrella is folded, causing the struts to rotate via the first, second, third, and fourth strut hinges so that the angle between the top of the first strut and the top of the cap decreases from the second angle to the first angle.

19. The umbrella of claim 17 wherein the printed circuit board comprises an analog-to-digital converter circuit, coupled to the rechargeable battery, and the umbrella further comprises:

a battery gauge circuit, coupled to the analog-to-digital converter circuit, wherein the battery gauge circuit comprises a plurality of light emitting diodes (LEDs), and the battery gauge circuit causes one or more of the LEDs to illuminate to indicate an amount of charge remaining in the rechargeable battery, and a greater number of LEDs that are illuminated indicates a greater amount of charge remaining in the rechargeable battery.

20. The umbrella of claim 17 wherein the second voltage level is above the first voltage level.

21. The umbrella of claim 1 wherein the cap retainer secures the cap to the umbrella shade, and the cap remains secured to the umbrella shade when the umbrella is in the closed position and the open position.

* * * * *